(12) United States Patent
Lu et al.

(10) Patent No.: US 11,276,750 B2
(45) Date of Patent: Mar. 15, 2022

(54) CAPACITOR AND METHOD FOR FABRICATING THE SAME

(71) Applicant: SHENZHEN GOODIX TECHNOLOGY CO., LTD., Shenzhen (CN)

(72) Inventors: Bin Lu, Shenzhen (CN); Jian Shen, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 56 days.

(21) Appl. No.: 17/024,650

(22) Filed: Sep. 17, 2020

(65) Prior Publication Data
US 2021/0005708 A1 Jan. 7, 2021

Related U.S. Application Data

(63) Continuation of application No. PCT/CN2019/078000, filed on Mar. 13, 2019.

(51) Int. Cl.
*H01L 29/94* (2006.01)
*H01G 4/33* (2006.01)
(Continued)

(52) U.S. Cl.
CPC .............. *H01L 28/91* (2013.01); *H01G 4/012* (2013.01); *H01G 4/33* (2013.01); *H01G 4/385* (2013.01);
(Continued)

(58) Field of Classification Search
CPC ....... H01L 28/40; H01L 75/81; H01L 29/945; H01L 23/5223; H01L 23/481; H01G 4/30; H01G 4/33; H01G 4/232
See application file for complete search history.

(56) References Cited

U.S. PATENT DOCUMENTS 9,178,080 B2 * 11/2015 Kalnitsky ............. H01L 29/945
9,647,057 B2 5/2017 Voiron
(Continued)

FOREIGN PATENT DOCUMENTS

CN 103348443 A 10/2013
CN 106158736 A 11/2016
(Continued)

*Primary Examiner* — Jose R Diaz
(74) *Attorney, Agent, or Firm* — Scully Scott Murphy & Presser

(57) ABSTRACT

A capacitor includes: a semiconductor substrate; a first insulating layer disposed under the substrate; a first trench group disposed in the substrate and the first insulating layer, the first trench group includes two first trenches which penetrate through the substrate downward from an upper surface of the substrate and enter the first insulating layer, and bottoms of the two first trenches are communicated to form a first cavity structure located in the first insulating layer; a laminated structure disposed above the substrate, in the first trench group, and in the first cavity structure, the laminated structure includes m insulating layers and n conductive layers forming a structure that each insulating layer electrically isolates each conductive layer from each other; a first electrode layer electrically connected to all odd-numbered conductive layers; and a second electrode layer electrically connected to all even-numbered conductive layers.

20 Claims, 13 Drawing Sheets

(51) Int. Cl.
*H01G 4/38* (2006.01)
*H01G 4/012* (2006.01)
*H01L 49/02* (2006.01)

(52) U.S. Cl.
CPC ............. *H01L 28/40* (2013.01); *H01L 28/75* (2013.01); *H01L 29/945* (2013.01)

(56) References Cited

U.S. PATENT DOCUMENTS

| | | |
|---|---|---|
| 9,793,340 B2 | 10/2017 | Voiron et al. |
| 10,403,710 B2 | 9/2019 | Voiron et al. |
| 2010/0032801 A1 | 2/2010 | Jacobs et al. |
| 2012/0049320 A1 | 3/2012 | Parsey, Jr. et al. |
| 2012/0080772 A1 | 4/2012 | Asami et al. |
| 2012/0146182 A1 | 6/2012 | Oganesian et al. |
| 2013/0277807 A1 | 10/2013 | Parsey, Jr. et al. |
| 2013/0313680 A1 | 11/2013 | Oganesian et al. |
| 2016/0315139 A1 | 10/2016 | Oganesian et al. |
| 2017/0053979 A1* | 2/2017 | Voiron .............. H01L 29/66181 |
| 2017/0104057 A1 | 4/2017 | Voiron |
| 2019/0035880 A1 | 1/2019 | Voiron et al. |
| 2019/0074349 A1* | 3/2019 | Lin ..................... H01L 28/87 |
| 2019/0131387 A1 | 5/2019 | Oganesian et al. |

FOREIGN PATENT DOCUMENTS

| | | |
|---|---|---|
| CN | 106170858 A | 11/2016 |
| CN | 108389847 A | 8/2018 |
| CN | 108987374 A | 12/2018 |
| CN | 109075164 A | 12/2018 |
| EP | 2 423 947 A2 | 2/2012 |
| EP | 2 924 730 A1 | 9/2015 |

* cited by examiner

300

| Providing an SOI substrate, where the SOI substrate includes a semiconductor substrate, a first insulating layer and a base, and the first insulating layer is disposed between the semiconductor substrate and the base | ~ 301 |

| Fabricating a first trench group and a second trench group on the SOI substrate, where the first trench group includes at least two first trenches which penetrate through the semiconductor substrate downward from an upper surface of the semiconductor substrate and enter the first insulating layer, and bottoms of the at least two first trenches are communicated to form a first cavity structure located in the first insulating layer; and the second trench group includes at least two second trenches which penetrate through the semiconductor substrate downward from the upper surface of the semiconductor substrate and enter the first insulating layer, and bottoms of the at least two second trenches are communicated to form a second cavity structure located in the first insulating layer | ~ 302 |

| Fabricating a laminated structure above the semiconductor substrate, in the first trench group, in the first cavity structure, in the second trench group, and in the second cavity structure, where the laminated structure includes m insulating layer(s) and n conductive layers, and the m insulating layer(s) and the n conductive layers form a structure that a conductive layer and an insulating layer are adjacent to each other, so that a corresponding insulating layer in the m insulating layer(s) electrically isolates the n conductive layers from each other, and m and n are positive integers | ~ 303 |

| Fabricating a first electrode layer, a second electrode layer, a third electrode layer and a fourth electrode layer, where the first electrode layer is electrically connected to all of odd-numbered conductive layers in the n conductive layers located in the first trench group, the second electrode layer is electrically connected to all of even-numbered conductive layers in the n conductive layers located in the first trench group, the third electrode layer is electrically connected to all of odd-numbered conductive layers in the n conductive layers located in the second trench group, and the fourth electrode layer is electrically connected to an even-numbered conductive layer in the n conductive layers located in the second trench group | ~ 304 |

FIG. 9

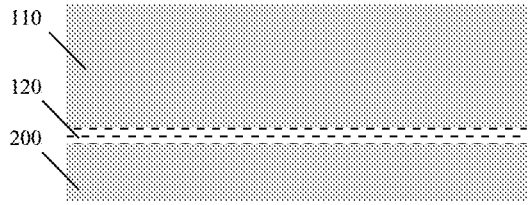

FIG. 10a

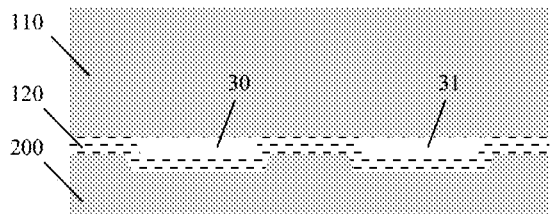

| Step | Description |
|---|---|
| 401 | Etching a semiconductor substrate to form a first trench group and a second trench group in the semiconductor substrate, where the first trench group includes at least two first trenches which enter the semiconductor substrate downward from an upper surface of the semiconductor substrate; and the second trench group includes at least two second trenches which enter the semiconductor substrate downward from the upper surface of the semiconductor substrate |
| 402 | Fabricating a laminated structure above the semiconductor substrate, in the first trench group and in the second trench group, where the laminated structure includes m insulating layer(s) and n conductive layers, and the m insulating layer(s) and the n conductive layers form a structure that a conductive layer and an insulating layer are adjacent to each other, so that a corresponding insulating layer in the m insulating layer(s) electrically isolates the n conductive layers from each other, and m and n are positive integers |
| 403 | Depositing an etching stop layer above the laminated structure |
| 404 | Depositing a fifth insulating layer on the etching stop layer |
| 405 | Fabricating a second electrode layer (an fourth electrode layer) in the fifth insulating layer and on an upper surface of the fifth insulating layer, and the second electrode layer is electrically connected to all of even-numbered conductive layers in the n conductive layers located in the first trench group and the semiconductor substrate, and the fourth electrode layer is electrically connected to all of even-numbered conductive layers in the n conductive layers located in the second trench group and the semiconductor substrate |
| 406 | Thinning a lower surface of the semiconductor substrate to expose the first trench group and the second trench group |
| 407 | Depositing a first insulating layer on the lower surface of the semiconductor substrate to cover the first trench group and the second trench group |
| 408 | Removing part of the first insulating layer and an insulating layer located at bottoms of the first trench and the second trench from a lower surface of the first insulating layer to expose all of odd-numbered conductive layers in the n conductive layers |
| 409 | Depositing a first electrode layer (a third electrode layer) on the lower surface of the first insulating layer, where the first electrode layer is electrically connected to all of odd-numbered conductive layers in the n conductive layers located in the first trench group, and the third electrode layer is electrically connected to all of odd-numbered conductive layers in the n conductive layers located in the second trench group |

FIG. 11

CAPACITOR AND METHOD FOR FABRICATING THE SAME

CROSS-REFERENCE TO RELATED APPLICATIONS

This application is a continuation of International Application No. PCT/CN2019/078000, filed on Mar. 13, 2019, the disclosure of which is hereby incorporated by reference in its entirety.

TECHNICAL FIELD

The present disclosure relates to the field of capacitors, and in particular, to a capacitor and a method for fabricating the same.

BACKGROUND

A capacitor may play a role of bypassing, filtering, decoupling, or the like in a circuit, which is an indispensable part of ensuring a normal operation of the circuit. With the continuous development of modern electronic system towards multi-function, high integration, low power consumption and miniaturization, an existing capacitor manufacturing technology has been unable to meet diversified needs of various high-end applications.

A wafer-level three-dimensional (3D) capacitor is a new type of capacitor fabricated on a silicon wafer by utilizing a semiconductor processing technology in recent years. Compared with a commonly used multilayer ceramic capacitor, the wafer-level three-dimensional capacitor has significant advantages in terms of minimum thickness, frequency response, and temperature coefficient of a chip. The wafer-level 3D capacitor has a wide range of applications in consumer electronics that require an extremely small size of a device, or in medical, vehicle-mounted device, aerospace electronics fields that require strict device performance and reliability.

However, at present, capacitance density of the wafer-level 3D capacitor is still limited, and how to improve the capacitance density of the capacitor has become an urgent technical problem to be resolved.

SUMMARY

The present disclosure provides a capacitor and a method for fabricating the same, which could improve capacitance density of the capacitor.

According to a first aspect, provided is a capacitor, including:

a semiconductor substrate;

a first insulating layer disposed under the semiconductor substrate;

a first trench group disposed in the semiconductor substrate and the first insulating layer, where the first trench group includes at least two first trenches which penetrate through the semiconductor substrate downward from an upper surface of the semiconductor substrate and enter the first insulating layer, and bottoms of the at least two first trenches are communicated to form a first cavity structure located in the first insulating layer;

a laminated structure disposed above the semiconductor substrate, in the first trench group, and in the first cavity structure, where the laminated structure includes m insulating layer(s) and n conductive layers, and the m insulating layer(s) and the n conductive layers form a structure that a conductive layer and an insulating layer are adjacent to each other so that corresponding insulating layer(s) in the m insulating layer(s) electrically isolates the n conductive layers from each other, and m and n are positive integers;

a first electrode layer electrically connected to all odd-numbered conductive layer(s) in the n conductive layers disposed in the first trench group; and a second electrode layer electrically connected to all even-numbered conductive layer(s) in the n conductive layers disposed in the first trench group.

It should be noted that the laminated structure is disposed in the first cavity structure, and a conductive platform with a large area can be formed in the first cavity structure, which is convenient for fabricating the first electrode layer.

Therefore, in the capacitor provided by an embodiment of the present disclosure, a laminated structure that a conductive layer and an insulating layer are alternately stacked is adopted and is disposed above the semiconductor substrate, in the first trench group, and in the first cavity structure, so that a larger capacitance value may be obtained under the condition of a smaller device size, and thus capacitance density of the capacitor could be improved.

Optionally, the capacitor provided by an embodiment of the present disclosure is a wafer-level 3D silicon capacitor, which has characteristics of small size and high capacity, excellent performance and stability, and high capacitance density. At the same time, the capacitor described in the embodiment of the present disclosure may play a role of bypassing, filtering, decoupling, or the like in a circuit.

Optionally, the semiconductor substrate is preferably an n-type or p-type heavily doped low-resistivity silicon wafer. A high-resistivity wafer may also be selected, but after the trench group is fabricated, an upper surface (front side) of the semiconductor substrate and a surface of the trench group are required to be doped to form a heavily doped low-resistivity conductive layer.

It should be noted that in the laminated structure, an order of the m insulating layers may be an order of a distance from the semiconductor substrate in an ascending or descending manner in the trench group. Similarly, an order of then conductive layers may also be an order of a distance from the semiconductor substrate in an ascending or descending manner in the trench group. For ease of description, in an embodiment of the present disclosure, the order of the m insulating layers and then conductive layers is illustrated by taking an order of a distance from the semiconductor substrate in an ascending manner in the trench group as an example.

In some possible implementations, the first electrode layer is electrically connected to all the odd-numbered conductive layer(s) in the n conductive layers disposed in the first trench group through at least one first via structure.

In some possible implementations, the second electrode layer is electrically connected to all the even-numbered conductive layer(s) in the n conductive layers disposed in the first trench group through at least one second via structure.

In some possible implementations, the first electrode layer is further electrically connected to the semiconductor substrate.

In some possible implementations, the first electrode layer is electrically connected to the semiconductor substrate through at least one third via structure.

In some possible implementations, the second electrode layer is further electrically connected to the semiconductor substrate.

In some possible implementations, the second electrode layer is electrically connected to the semiconductor substrate through at least one fourth via structure.

In some possible implementations, a corresponding insulating layer in the m insulating layer(s) electrically isolates the n conductive layers from the semiconductor substrate.

In some possible implementations, part or all of the n conductive layers are disposed in the first cavity structure.

In some possible implementations, no insulating layer is provided under a conductive layer located at a bottom of the first trench group and a bottom of the first cavity structure.

In some possible implementations, the capacitor further includes:

a first conductive layer disposed under the first insulating layer, where the first conductive layer includes a first conductive region and a second conductive region separated from each other, the first conductive region forms the first electrode layer, and the second conductive region forms the second electrode layer.

Optionally, the first conductive region and the second conductive region are isolated by air.

In some possible implementations, the capacitor further includes:

a base disposed between the first insulating layer and the first conductive layer, where the base forms a semiconductor on insulator (SOI) substrate with the semiconductor substrate and the first insulating layer; and a second insulating layer disposed between the first conductive layer and the base to isolate the first conductive layer from the base.

Optionally, when the second electrode layer is electrically connected to all the even-numbered conductive layer(s) in the n conductive layers disposed in the first trench group and the semiconductor substrate, and the second electrode layer is electrically connected to all the even-numbered conductive layer(s) in the n conductive layers disposed in the first trench group through the semiconductor substrate, the first electrode layer may be electrically connected to all the odd-numbered conductive layer(s) in the n conductive layers disposed in the first trench group through at least one first via structure, and the second electrode layer may be electrically connected to the semiconductor substrate through at least one fourth via structure. Specifically, the at least one first via structure is disposed in the base and formed upward from a lower surface of the base to expose all the odd-numbered conductive layer(s) in the n conductive layers disposed in the first trench group, and the first conductive layer is disposed in the first via structure to electrically connect the first electrode layer to all the odd-numbered conductive layer(s) in the n conductive layers disposed in the first trench group; and the at least one fourth via structure is disposed in the base and the first insulating layer and formed upward from the lower surface of the base to expose the semiconductor substrate, and the first conductive layer is disposed in the fourth via structure to electrically connect the second electrode layer to the semiconductor substrate.

In some possible implementations, the first electrode layer is disposed under the first insulating layer, and the second electrode layer is disposed above the laminated structure.

In some possible implementations, the laminated structure includes:

a second conductive layer disposed above the semiconductor substrate, in the first trench group and in the first cavity structure, the second conductive layer being electrically connected to the first electrode layer;

a third insulating layer disposed between the semiconductor substrate and the second conductive layer to isolate the second conductive layer from the semiconductor substrate;

a third conductive layer disposed above the semiconductor substrate and in the first trench group, the third conductive layer being electrically connected to the second electrode layer; and a fourth insulating layer disposed between the second conductive layer and the third conductive layer to isolate the second conductive layer from the third conductive layer;

where the third insulating layer is not provided under the second conductive layer at the bottom of the first trench group and the bottom of the first cavity structure.

In some possible implementations, the laminated structure includes:

a second conductive layer disposed above the semiconductor substrate, in the first trench group and in the first cavity structure, the second conductive layer being electrically connected to the first electrode layer;

a third insulating layer disposed between the semiconductor substrate and the second conductive layer to isolate the second conductive layer from the semiconductor substrate;

a third conductive layer disposed above the semiconductor substrate, in the first trench group and in the first cavity structure, the third conductive layer being electrically connected to the second electrode layer; and a fourth insulating layer disposed between the second conductive layer and the third conductive layer to isolate the second conductive layer from the third conductive layer;

where the third insulating layer is not provided under the second conductive layer at the bottom of the first trench group and the bottom of the first cavity structure.

In some possible implementations, the capacitor further includes:

a fifth insulating layer disposed above the semiconductor substrate and the third conductive layer; and an interconnection structure disposed in the fifth insulating layer and on an upper surface of the fifth insulating layer, and configured to electrically connect the third conductive layer and the semiconductor substrate.

Optionally, the interconnection structure includes a first metal layer disposed on the upper surface of the fifth insulating layer and at least two conductive channels disposed in the fifth insulating layer, and one part of the at least two conductive channels is connected to the third conductive layer and the other part thereof is connected to the semiconductor substrate.

For example, the first metal layer is a copper layer.

In some possible implementations, the interconnection structure electrically connects the third conductive layer and the semiconductor substrate through at least two conductive channels disposed in the fifth insulating layer.

In some possible implementations, the capacitor further includes:

an etching stop layer disposed between the fifth insulating layer and the semiconductor substrate and between the fifth insulating layer and the third conductive layer, where the at least two conductive channels penetrate through the etching stop layer.

It should be noted that the etching stop layer is more resistant to etching than the fifth insulating layer; when the at least two conductive channels are etched, bottoms of the conductive channels are enabled to stay on the etching stop layer at different depths, and then part of the etching stop layer exposed at the bottoms of the conductive channels is removed by a dry or wet process, so that the at least two conductive channels penetrate through the etching stop layer.

Therefore, setting the etching stop layer may better control an etching course to form the at least two conductive channels.

For example, the etching stop layer may be a silicon nitride layer.

In some possible implementations, the second electrode layer is electrically connected to the second conductive layer disposed in the first trench group through the semiconductor substrate electrically connected to the second conductive layer. That is, the second electrode layer is electrically connected to all the even-numbered conductive layer(s) in the n conductive layers disposed in the first trench group and the semiconductor substrate.

In other words, the second electrode layer is electrically connected to the semiconductor substrate, and the semiconductor substrate is electrically connected to the second conductive layer through a second metal interconnection structure, that is, the second electrode layer is electrically connected to the second conductive layer.

In some possible implementations, the second electrode layer is electrically connected to the semiconductor substrate through at least one fourth via structure. Specifically, the at least one fourth via structure is disposed in the first insulating layer and formed upward from a lower surface of the first insulating layer to expose the semiconductor substrate. Optionally, the second conductive layer is disposed in the fourth via structure to electrically connect the second electrode layer to the semiconductor substrate.

In some possible implementations, the capacitor further includes a second trench group, a third electrode layer, and a fourth electrode layer, where the second trench group is disposed in the semiconductor substrate and the first insulating layer and includes at least two second trenches which penetrate through the semiconductor substrate downward from the upper surface of the semiconductor substrate and enter the first insulating layer, and bottoms of the at least two second trenches are communicated to form a second cavity structure located in the first insulating layer;

the laminated structure is further disposed in the second trench group and the second cavity structure, and there is no electrically connected conductive layer between the laminated structure disposed in the second trench group and the laminated structure disposed in the first trench group; and the third electrode layer is electrically connected to all odd-numbered conductive layer(s) in the n conductive layers disposed in the second trench group, and the fourth electrode is electrically connected to all even-numbered conductive layer(s) in the n conductive layers disposed in the second trench group.

In some possible implementations, the third electrode and the first electrode are a same electrode, and the fourth electrode and the second electrode are a same electrode; or the third electrode and the first electrode are different electrodes, and the fourth electrode and the second electrode are a same electrode; or the third electrode and the first electrode are a same electrode, and the fourth electrode and the second electrode are different electrodes; or the third electrode and the first electrode are different electrodes, and the fourth electrode and the second electrode are different electrodes.

In some possible implementations, each of the m insulating layers includes at least one of the following layers:

a silicon oxide layer, a silicon nitride layer, a silicon oxynitride layer, a metal oxide layer, a metal nitride layer, and a metal oxynitride layer.

In some possible implementations, each of the n conductive layers includes at least one of the following layers:

a heavily doped polysilicon layer, a carbon-based material layer, a metal layer, a titanium nitride layer, and a tantalum nitride layer.

Optionally, the foregoing metal layer may be at least one of an aluminum (Al) layer, a tungsten (W) layer, a copper (Cu) layer, a titanium (Ti) layer, a tantalum (Ta) layer, a platinum (Pt) layer, a ruthenium (Ru) layer, a iridium (Ir) layer and a rhodium (Rh) layer.

In a second aspect, provided is a method for fabricating a capacitor, including:

providing a semiconductor on insulator (Silicon on Insulator, SOI substrate, where the SOI substrate includes a semiconductor substrate, a first insulating layer and a base, and the first insulating layer is disposed between the semiconductor substrate and the base;

fabricating a first trench group on the SOI substrate, where the first trench group includes at least two first trenches which penetrate through the semiconductor substrate downward from an upper surface of the semiconductor substrate and enter the first insulating layer, and bottoms of the at least two first trenches are communicated to form a first cavity structure located in the first insulating layer;

fabricating a laminated structure above the semiconductor substrate, in the first trench group, and in the first cavity structure, where the laminated structure includes m insulating layer(s) and n conductive layers, and the m insulating layer(s) and the n conductive layers form a structure that a conductive layer and an insulating layer are adjacent to each other so that corresponding insulating layer(s) in the m insulating layer(s) electrically isolates the n conductive layers from each other, and m and n are positive integers; and fabricating a first electrode layer and a second electrode layer, where the first electrode layer is electrically connected to all odd-numbered conductive layer(s) in the n conductive layers located in the first trench group, and the second electrode layer is electrically connected to all even-numbered conductive layer(s) in the n conductive layers located in the first trench group.

Therefore, in the method for fabricating the capacitor provided by an embodiment of the present disclosure, a laminated structure including a larger number of conductive layers and insulating layers may be obtained by means of fabricating the laminated structure, and a capacitance value of the capacitor is increased, and the laminated structure formed by the first trench group may further increase the capacitance value of the capacitor, thereby improving capacitance density of the capacitor.

In some possible implementations, the fabricating the first trench group on the SOI substrate includes:

etching the SOI substrate to form the first trench group in the SOI substrate, and removing part of the first insulating layer exposed at the bottoms of the at least two first trenches to form the first cavity structure communicating with the bottoms of the at least two first trenches.

Optionally, the SOI substrate is etched by deep reactive ion etch (Deep Reactive Ion Etch, DRIE) to form the first trench group in the SOI substrate.

In some possible implementations, the first cavity structure is formed between the first insulating layer and the semiconductor substrate in the SOI substrate; and the fabricating the first trench group on the SOI substrate includes:

etching the SOI substrate to form the first trench group in the SOI substrate, where the first cavity structure is communicated with the bottoms of the at least two first trenches.

Optionally, the SOI substrate is etched by DRIE to form the first trench group in the SOI substrate.

In some possible implementations, the method further includes:

fabricating at least one first via structure so that the first electrode layer is electrically connected to all the odd-numbered conductive layer(s) in the n conductive layers located in the first trench group through the at least one first via structure.

In some possible implementations, the method further includes:

fabricating at least one second via structure so that the second electrode layer is electrically connected to all the even-numbered conductive layer(s) in the n conductive layers located in the first trench group through the at least one second via structure.

In some possible implementations, the first electrode layer is further electrically connected to the semiconductor substrate.

In some possible implementations, the method further includes:

fabricating at least one third via structure so that the first electrode layer is electrically connected to the semiconductor substrate through the at least one third via structure.

In some possible implementations, the second electrode layer is further electrically connected to the semiconductor substrate.

In some possible implementations, the method further includes:

fabricating at least one fourth via structure so that the second electrode layer is electrically connected to the semiconductor substrate through the at least one fourth via structure.

In some possible implementations, a corresponding insulating layer in the m insulating layer(s) electrically isolates the n conductive layers from the semiconductor substrate.

In some possible implementations, part or all of the n conductive layers are disposed in the first cavity structure.

In some possible implementations, the method further includes:

removing the base to expose the first insulating layer and an insulating layer located at a bottom of the first trench group and a bottom of the first cavity structure; and removing the insulating layer located at the bottom of the first trench group and the bottom of the first cavity structure to expose a conductive layer located at the bottom of the first trench group and the bottom of the first cavity structure.

In some possible implementations, the method further includes:

depositing a first conductive layer under the first insulating layer;

where the fabricating the first electrode layer and the second electrode layer includes:

etching the first conductive layer to form a first conductive region and a second conductive region separated from each other, where the first conductive region forms the first electrode layer and the second conductive region forms the second electrode layer.

In some possible implementations, the method further includes:

depositing a second insulating layer under the base; and depositing a first conductive layer on a lower surface of the second insulating layer, where the second insulating layer isolates the first conductive layer from the base; and the fabricating the first electrode layer and the second electrode layer includes:

etching the first conductive layer to form a first conductive region and a second conductive region separated from each other, where the first conductive region forms the first electrode layer and the second conductive region forms the second electrode layer.

In some possible implementations, the fabricating the first electrode layer and the second electrode layer includes:

depositing the first electrode layer under the first insulating layer, and depositing the second electrode layer above the laminated structure.

In some possible implementations, the laminated structure includes: a second conductive layer, a third conductive layer, a third insulating layer and a fourth insulating layer; and the fabricating the laminated structure above the semiconductor substrate, in the first trench group and in the first cavity structure includes:

depositing the third insulating layer on the upper surface of the semiconductor substrate, an inner surface of the first trench group and an inner surface of the first cavity structure;

depositing the second conductive layer on an upper surface and an inner surface of the third insulating layer;

depositing the fourth insulating on an upper surface and an inner surface of the second conductive layer and the upper surface of the semiconductor substrate;

depositing the third conductive layer on an upper surface and an inner surface of the fourth insulating layer and the upper surface of the semiconductor substrate; and performing photolithography on the third insulating layer, the second conductive layer, the fourth insulating layer and the third conductive layer to expose the upper surface of the semiconductor substrate.

In some possible implementations, the method further includes:

depositing a fifth insulating layer above the semiconductor substrate and the third conductive layer; and fabricating a second metal interconnection structure in the fifth insulating layer and on an upper surface of the fifth insulating layer to electrically connect the third conductive layer and the semiconductor substrate.

In some possible implementations, the interconnection structure includes a first metal layer disposed on the upper surface of the fifth insulating layer and at least two conductive channels disposed in the fifth insulating layer, and one part of the at least two conductive channels is connected to the third conductive layer and the other part thereof is connected to the semiconductor substrate; and the fabricating the interconnection structure in the fifth insulating layer and on the upper surface of the fifth insulating layer includes:

depositing the first metal layer on the upper surface of the fifth insulating layer;

etching the fifth insulating layer to form at least two channels; and depositing a conductive material in the at least two channels to form the at least two conductive channels.

In some possible implementations, before the depositing the fifth insulating layer, the method further includes:

depositing an etching stop layer above the semiconductor substrate and the third conductive layer; and the etching the fifth insulating layer to form the at least two channels includes:

etching the fifth insulating layer to form the at least two channels above the etching stop layer, and removing part of the etching stop layer exposed at bottoms of the at least two channels to expose the semiconductor substrate and/or the third conductive layer.

In some possible implementations, the method further includes:

removing the base to expose the first insulating layer and the third insulating layer; and removing the third insulating layer at the bottom of the first trench group and the bottom of the first cavity structure to expose the second conductive layer.

In some possible implementations, the method further includes:

etching the first insulating layer to form at least one fourth via structure, where the fourth via structure is formed upward from a lower surface of the first insulating layer to expose the semiconductor substrate, and the first conductive layer is disposed in the fourth via structure to electrically connect the second electrode layer to the semiconductor substrate.

In some possible implementations, the method further includes:

etching the base to form at least one first via structure and at least one fourth via structure, where the at least one first via structure is formed upward from a lower surface of the base to expose the second conductive layer; and the at least one fourth via structure is formed upward from the lower surface of the base to expose the semiconductor substrate;

depositing a second insulating layer under the base and on inner surfaces of the first via structure and the fourth via structure;

removing the second insulating layer at a bottom of the first via structure to expose the second conductive layer, and removing the second insulating layer at a bottom of the fourth via structure to expose the semiconductor substrate; and depositing a first conductive layer on a lower surface and an inner surface of the second insulating layer; and the fabricating the first electrode layer and the second electrode layer includes:

etching the first conductive layer to form a first conductive region and a second conductive region separated from each other, where the first via structure is located in the second conductive region, the fourth via structure is located in the first conductive region, the first conductive region forms the first electrode layer, and the second conductive region forms the second electrode layer.

In some possible implementations, the method further includes:

fabricating a second trench group on the SOI substrate, where the second trench group includes at least two second trenches which penetrate through the semiconductor substrate downward from the upper surface of the semiconductor substrate and enter the first insulating layer, and bottoms of the at least two second trenches are communicated to form a second cavity structure located in the first insulating layer;

fabricating the laminated structure above the semiconductor substrate, in the second trench group and in the second cavity structure, where there is no electrically connected conductive layer between the laminated structure located in the second trench group and the laminated structure located in the first trench group; and fabricating a third electrode layer and a fourth electrode layer, where the third electrode layer is electrically connected to all odd-numbered conductive layer(s) in the n conductive layers located in the second trench group, and the fourth electrode layer is electrically connected to all even-numbered conductive layer(s) in the n conductive layers located in the second trench group.

In some possible implementations, the third electrode and the first electrode are a same electrode, and the fourth electrode and the second electrode are a same electrode; or the third electrode and the first electrode are different electrodes, and the fourth electrode and the second electrode are a same electrode; or the third electrode and the first electrode are a same electrode, and the fourth electrode and the second electrode are different electrodes; or the third electrode and the first electrode are different electrodes, and the fourth electrode and the second electrode are different electrodes.

BRIEF DESCRIPTION OF THE DRAWINGS

FIG. 9 is a schematic flow chart of a method for fabricating a capacitor according to an embodiment of the present disclosure.

FIG. 11 is a schematic flow chart of a method for fabricating another capacitor according to an embodiment of the present disclosure.

DESCRIPTION OF EMBODIMENTS

Figure 1:
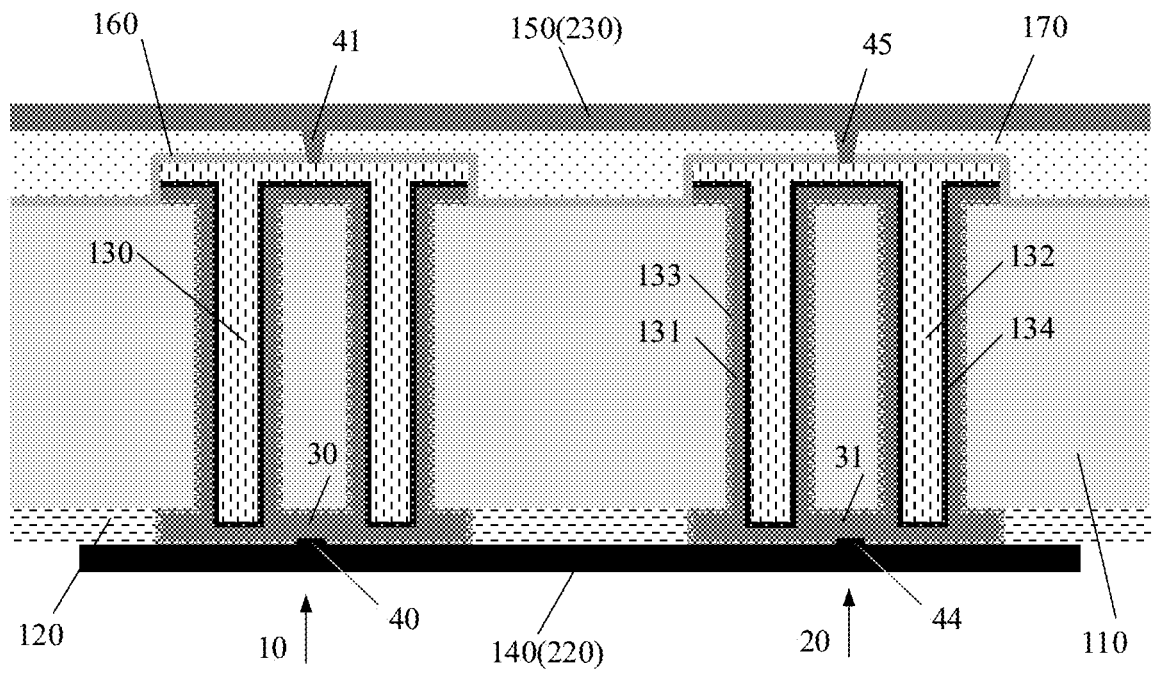
FIG. 1 is a schematic structural diagram of a capacitor according to an embodiment of the present disclosure.

Technical solutions in embodiments of the present disclosure will be described hereinafter with reference to the accompanying drawings.

It should be understood that a capacitor of an embodiment of the present disclosure may play a role of bypassing, filtering, decoupling, or the like in a circuit.

The capacitor described in the embodiment of the present disclosure may be a 3D silicon capacitor which is a novel capacitor based on semiconductor wafer processing techniques. Compared with a traditional MLCC (multi-layer ceramic capacitor), the 3D silicon capacitor has advantages of small size, high precision, strong stability, and long lifetime. In a basic processing flow, a 3D structure with a high aspect ratio such as a deep via, a trench, a pillar shape, a wall shape, or the like is required to be first processed on a wafer or substrate, and then an insulating film and a low-resistivity conductive material are deposited on a surface of the 3D structure to fabricate a lower electrode, an dielectric layer and an upper electrode of the capacitor, sequentially.

At present stage, based on a concept of multi-layer nesting in the manufacture of a DRAM, the 3D silicon capacitor is fabricated by alternately depositing a conductor and an insulator material on a surface of a 3D structure to form a structure with a plurality of capacitors vertically stacked, then connecting all the capacitors in parallel by different connection manners on the front side of a silicon substrate to finally form a capacitor with a large capacitance value. However, at present, capacitance density of the wafer-level 3D capacitor is still limited. In this context, the present disclosure proposes a novel capacitor structure and a method for fabricating the same, which may improve capacitance density of the capacitor.

Hereinafter, a capacitor according to an embodiment of the present disclosure will be introduced in detail with reference to FIGS. 1 to 8.

It should be understood that capacitors in FIGS. 1 to 8 are merely examples, and the number of trench groups included in the capacitors and the number of trenches included in each trench group are not limited to that included in the capacitors as shown in FIGS. 1 to 8, and may be determined according to actual needs. Meanwhile, in embodiments of FIGS. 1 to 8, description is made by an example where an extending direction of a trench is a direction perpendicular to a semiconductor substrate (wafer). In the embodiments of the present disclosure, the extending direction of the trench may also be some other directions, for example, any direction satisfying that an angle with respect to the direction perpendicular to the semiconductor substrate (wafer) is less than a preset value.

It should be noted that in embodiments shown below, for structures shown in different embodiments, like structures are denoted by like reference numerals for ease of understanding, and detailed description of the same structures is omitted for brevity.

FIG. 1 is a possible structural diagram of a capacitor 100 according to an embodiment of the present disclosure. As shown in FIG. 1, the capacitor 100 includes a semiconductor substrate 110, a first insulating layer 120, a laminated structure 130, a first electrode layer 140 and a second electrode layer 150.

Specifically, as shown in FIG. 1, in the capacitor 100, the first insulating layer 120 is disposed under the semiconductor substrate 110; a first trench group 10 is disposed in the semiconductor substrate 110 and the first insulating layer 120, the first trench group 10 includes at least two first trenches which penetrate through the semiconductor substrate 110 downward from an upper surface of the semiconductor substrate 110 and enter the first insulating layer 120, and bottoms of the at least two first trenches are communicated to form a first cavity structure 30 located in the first insulating layer 120; the laminated structure 130 is disposed above the semiconductor substrate 110, in the first trench group 10 and in the first cavity structure 30, the laminated structure 130 includes m insulating layer(s) and n conductive layers, and the m insulating layer(s) and the n conductive layers form a structure that a conductive layer and an insulating layer are adjacent to each other so that corresponding insulating layer(s) in the m insulating layer(s) electrically isolates the n conductive layers from each other, where m and n are positive integers; the first electrode layer 140 is electrically connected to all odd-numbered conductive layer(s) in the n conductive layers disposed in the first trench group 10; and the second electrode layer 150 is electrically connected to all even-numbered conductive layer(s) in then conductive layers disposed in the first trench group 10.

That is, in an embodiment of the present disclosure, two adjacent conductive layers in the n conductive layers are electrically isolated. The specific values of m and n can be flexibly configured according to actual needs as long as the electrical isolation between the two adjacent conductive layers in the n conductive layers is satisfied.

It should be noted that, in the embodiment of the present disclosure, a laminated structure that a conductive layer and an insulating layer are alternately stacked is adopted, so that a larger capacitance value may be obtained under the condition of a smaller device size, and thus the capacitance density of the capacitor could be improved. Further, the laminated structure 130 is disposed in the first cavity structure 30, and a conductive platform with a large area can be formed in the first cavity structure 30, which is convenient for fabricating an electrode layer disposed under the first insulating layer.

Optionally, in the embodiment of the present disclosure, the semiconductor substrate 110 is preferably an n-type or p-type heavily doped low-resistivity silicon wafer. A high-resistivity wafer may also be adopted, but after the first trench group 10 is fabricated, the upper surface (front side) of the semiconductor substrate 110 and a surface of the first trench group 10 are required to be doped to form a heavily doped low-resistivity conductive layer.

It should be noted that in the embodiment of the present disclosure, an order of the m insulating layers may be an order of a distance from the semiconductor substrate in an ascending or descending manner in the trench group. Similarly, an order of the n conductive layers may also be an order of a distance from the semiconductor substrate in an ascending or descending manner in the trench group. For ease of description, the order of the m insulating layers and the n conductive layers involved in the embodiment of the present disclosure is illustrated by taking an order of a distance from the semiconductor substrate in an ascending manner in the trench group as an example.

Optionally, the semiconductor substrate 110 and the first insulating layer 120 may be part of an SOI substrate, for example, the SOI substrate includes a semiconductor substrate, a first insulating layer and a base, and the first insulating layer is disposed between the semiconductor substrate and the base.

Optionally, in the embodiment of the present disclosure, the capacitor 100 further includes a second trench group 20, a third electrode 220 and a fourth electrode 230.

Specifically, as shown in FIG. 1, the second trench group 20 is disposed in the semiconductor substrate 110 and the first insulating layer 120, and includes at least two second trenches which penetrate through the semiconductor substrate 110 downward from the upper surface of the semiconductor substrate 110 and enter the first insulating layer 120, and bottoms of the at least two second trenches are communicated to form a second cavity structure 31 located in the first insulating layer 120; the laminated structure 130 is further disposed in the second trench group 20 and the second cavity structure 31, and there is no electrically connected conductive layer between the laminated structure 130 disposed in the second trench group 20 and the laminated structure 130 disposed in the first trench group 10; and the third electrode 220 is electrically connected to all odd-numbered conductive layer(s) in the n conductive layers disposed in the second trench group 20, and the fourth electrode 230 is electrically connected to all even-numbered conductive layer(s) in the n conductive layers disposed in the second trench group 20.

Optionally, the third electrode 220 and the first electrode 140 are a same electrode, and the fourth electrode 230 and the second electrode 150 are a same electrode. That is, an equivalent capacitor formed by the laminated structure 130 disposed in the first trench group 10 is connected in parallel with an equivalent capacitor formed by the laminated structure 130 disposed in the second trench group 20.

Optionally, the third electrode 220 and the first electrode 140 are different electrodes, and the fourth electrode 230 and the second electrode 150 are a same electrode. That is, an equivalent capacitor formed by the laminated structure 130 disposed in the first trench group 10 is connected in series with an equivalent capacitor formed by the laminated structure 130 disposed in the second trench group 20.

Optionally, the third electrode 220 and the first electrode 140 are a same electrode, and the fourth electrode 230 and the second electrode 150 are different electrodes. That is, an equivalent capacitor formed by the laminated structure 130 disposed in the first trench group 10 is connected in series with an equivalent capacitor formed by the laminated structure 130 disposed in the second trench group 20.

Optionally, the third electrode 220 and the first electrode 140 are different electrodes, and the fourth electrode 230 and the second electrode 150 are different electrodes. That is, an equivalent capacitor formed by the laminated structure 130 disposed in the first trench group 10 and an equivalent capacitor formed by the laminated structure 130 disposed in the second trench group 20 are two independent capacitors.

It should be noted that in the embodiment of the present disclosure, the capacitor 100 may include a larger number of trench groups, and an arrangement manner thereof may refer to that of the second trench group 20. Of course, the capacitor 100 may also include a larger number of electrodes, and a connection manner between the larger number of electrodes and the laminated structure 130 in the trench groups may refer to the third electrode 220 and the fourth electrode 230, which will not be repeatedly described here for brevity.

It should be noted that the embodiment of the present disclosure takes the simultaneous existence of the first trench group 10 and the second trench group 20 as an example, and only takes the third electrode 220 and the first electrode 140 being a same electrode and the fourth electrode 230 and the second electrode 150 being a same electrode as an example.

In the embodiment of the present disclosure, shapes of cross sections of different trench groups in the trench groups provided in the semiconductor substrate 110 may be the same or different. Furthermore, in the trench group, shapes of cross sections of different trenches may be the same or different.

It should be noted that in the embodiment of the application, a depth and width of the trench group provided in the semiconductor substrate 110 may be flexibly set according to actual needs, and depths of different trench groups in the trench groups provided in the semiconductor substrate 110 may be the same or different. In the embodiment of the application, a thickness of the semiconductor substrate 110 may also be flexibly set according to actual needs. For example, when a thickness of the semiconductor substrate 110 is too thick to meet requirements, the semiconductor substrate 110 may be thinned to meet the requirements for fabricating the capacitor.

It should be noted that, in the embodiment of the present disclosure, a size of a cross section of the trench provided in the semiconductor substrate 110 is not limited. For example, the first trench may be a hole with a small difference between length and width of a cross section, or a trench with a large difference between length and width, or may further be a 3D structure in a shape of a pillar or wall. Here, the cross section may be understood as a section parallel to the surface of the semiconductor substrate, and FIG. 1 shows a section along a longitudinal direction of the semiconductor substrate.

It should be understood that the insulating layer in the embodiment of the present disclosure may also be referred to as a dielectric layer.

Optionally, materials of the first electrode layer 140 and the second electrode layer 150 may adopt various conductive materials, such as metal copper. Optionally, materials of the third electrode 220 and the fourth electrode 230 may also adopt various conductive materials, such as metal copper.

It should be noted that the embodiment of the present disclosure only takes two adjacent first trenches as the first trench group 10 as an example for description, and the embodiment of the present disclosure only takes two adjacent second trenches as the second trench group 20 as an example for description.

Optionally, a material of the first insulating layer 120 may be an organic polymer material, including polyimide, parylene, benzocyclobutene (BCB), or the like; it may also be some inorganic materials, including spin on glass SOG), undoped silicon glass (USG), boro-silicate glass (BSG), phospho-silicate glass (PSG), boro-phospho-silicate glass (BPSG), silicon oxide synthesized by tetraethyl orthosilicate (TEOS), silicon oxide, silicon nitride and ceramic; and it may also be a combination of the foregoing materials.

Optionally, each of the m insulating layers includes at least one of the following layers:

a silicon oxide layer, a silicon nitride layer, a silicon oxynitride layer, a metal oxide layer, a metal nitride layer, and a metal oxynitride layer.

In other words, a material of the insulating layer in the laminated structure 130 may be silicon oxide, silicon nitride, silicon oxynitride, metal oxide, metal nitride and metal oxynitride, or the like, such as silicon dioxide, silicon nitride, or high dielectric constant materials including aluminum oxide, hafnium oxide, zirconium oxide, titanium dioxide, $Y_2O_3$, $La_2O_3$, $HfSiO_4$, $LaAlO_3$, $SrTiO_3$, $LaLuO_3$, or the like; and it may also be one or a combination of the foregoing materials. A specific insulating material and a layer thickness may be adjusted according to a capacitance value, a frequency characteristic, a loss and other requirements of a capacitor. Of course, the insulating layer in the laminated structure 130 may also include some other material layers having high dielectric constant characteristics, which is not limited in the embodiment of the present disclosure.

Optionally, each of the n conductive layers includes at least one of the following layers:

a heavily doped polysilicon layer, a carbon-based material layer, a metal layer, a titanium nitride layer and a tantalum nitride layer.

In other words, a material of the conductive layer in the laminated structure 130 may be heavily doped polysilicon, a carbon material, or various metals such as aluminum, tungsten, copper, titanium (Ti), tantalum (Ta), platinum (Pt), ruthenium (Ru), iridium (Ir), rhodium (Rh), or the like, or a low-resistivity compound such as titanium nitride and tantalum nitride, or a laminated layer or combination of the foregoing several conductive materials.

Optionally, in the embodiment of the present disclosure, the first electrode layer 140 is electrically connected to all the odd-numbered conductive layer(s) in the n conductive layers disposed in the first trench group 10 through at least one first via structure 40. Of course, the first electrode layer 140 may also be electrically connected to all the odd-numbered conductive layer(s) in the n conductive layers disposed in the first trench group 10 through a metal interconnection structure, which is not limited in the embodiment of the present disclosure.

It should be noted that the first electrode layer 140 is disposed in the at least one first via structure 40, thereby achieving the purpose of electrically connecting the first electrode layer 140 to all the odd-numbered conductive layer(s) in the n conductive layers disposed in the first trench group 10. Of course, other conductive materials may also be disposed in the at least one first via structure 40, so as to achieve the purpose of electrically connecting the first electrode layer 140 to all the odd-numbered conductive layer(s) in the n conductive layers disposed in the first trench group 10.

It should be understood that the shape and the number of the at least one first via structure 40 may be specifically determined according to a fabrication process of the capacitor 100, which is not limited in the embodiment of the present disclosure.

Optionally, in the embodiment of the present disclosure, the second electrode layer 150 is electrically connected to all the even-numbered conductive layer(s) in the n conductive layers disposed in the first trench group 10 through at least one second via structure 41. Of course, the second electrode layer 150 may also be electrically connected to all the even-numbered conductive layer(s) in the n conductive layers disposed in the first trench group 10 through a metal interconnection structure, which is not limited in the embodiment of the present disclosure.

It should be noted that the second electrode layer 150 is disposed in the at least one second via structure 41, thereby achieving the purpose of electrically connecting the second electrode layer 150 to all the even-numbered conductive layer(s) in the n conductive layers disposed in the first trench group 10. Of course, other conductive materials may also be disposed in the at least one second via structure 41, so as to achieve the purpose of electrically connecting the second electrode layer 150 to all the even-numbered conductive layer(s) in the n conductive layers disposed in the first trench group 10.

It should be understood that the shape and the number of the at least one second via structure 41 may be specifically determined according to a fabrication process of the capacitor 100, which is not limited in the embodiment of the present disclosure.

Optionally, in the embodiment of the present disclosure, the third electrode 220 may also be electrically connected to all odd-numbered conductive layer(s) in the n conductive layers disposed in the second trench group 20 through at least one fifth via structure 44. The fourth electrode 230 may also be electrically connected to all even-numbered conductive layer(s) in the n conductive layers disposed in the second trench group 20 through at least one sixth via structure 45.

It should be noted that the specific arrangement of the at least one fifth via structure 44 and the at least one sixth via structure 45 may refer to that of the first via structure 40 or the second via structure 41, which will not be repeatedly described here.

Optionally, in the embodiment of the present disclosure, no insulating layer is provided under a conductive layer located at a bottom of the first trench group 10 and a bottom of the first cavity structure 30. With such a design, an electrode layer disposed under the first insulating layer 120 may be directly electrically connected to the conductive layer located at the bottom of the first trench group 10 and the bottom of the first cavity structure 30. Similarly, no insulating layer is provided under a conductive layer located at a bottom of the second trench group 20 and a bottom of the second cavity structure 31. With such a design, the electrode layer disposed under the first insulating layer 120 may be directly electrically connected to the conductive layer located at the bottom of the second trench group 20 and the bottom of the second cavity structure 31.

Optionally, the laminated structure 130 is provided with a step structure, and the at least one first via structure 40 is disposed on the step structure, so that the first electrode 140 is electrically connected to all odd-numbered conductive layer(s) in the n conductive layers through the at least one first via structure 40; and the at least one second via structure 41 is also disposed on the step structure, so that the second electrode 150 is electrically connected to all even-numbered conductive layer(s) in the n conductive layers through the at least one second via structure 41. The arrangement of the fifth via structure 44 and the sixth via structure 45 is similar to that of the first via structure 40 and the second via structure 41.

It should be noted that the arrangement of the step structure is convenient for connection and isolation between different conductive layers.

Optionally, in the embodiment of the present disclosure, part or all of the n conductive layers are disposed in the first cavity structure 30. That is, in the laminated structure 130, part of the n conductive layers may be disposed above the semiconductor substrate 110, in the first trench group 10, and in the first cavity structure 30, and the rest part thereof is only disposed above the semiconductor substrate 110 and in the first trench group 10. It is also possible that all of the n conductive layers are disposed above the semiconductor substrate 110, in the first trench group 10 and in the first cavity structure 30. Similarly, part or all of the n conductive layers are disposed in the second cavity structure 31. That is, in the laminated structure 130, part of the n conductive layers may be disposed above the semiconductor substrate 110, in the second trench group 20 and in the second cavity structure 31, and the rest part thereof is only disposed above the semiconductor substrate 110 and in the second trench group 20. It is also possible that all of the n conductive layers are disposed above the semiconductor substrate 110, in the second trench group 20 and in the second cavity structure 31.

It should be noted that when all of the n conductive layers are disposed in the first cavity structure 30 and/or the second cavity structure 31, the capacitance density may be further increased.

Figure 2:
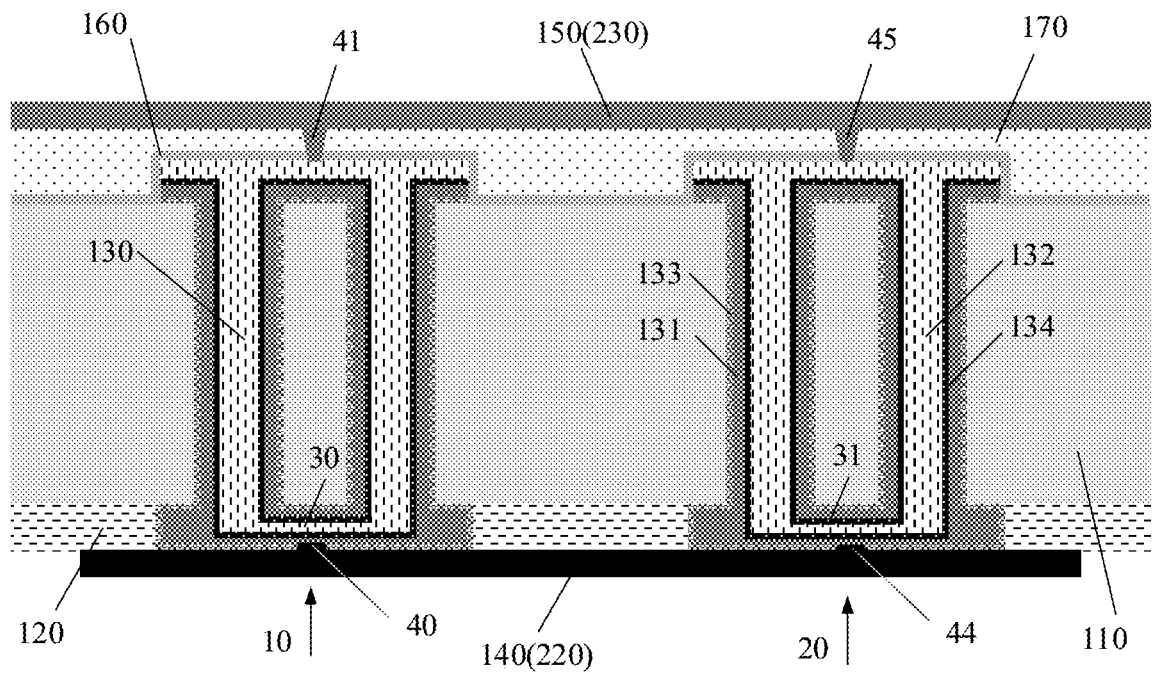
FIG. 2 is a schematic structural diagram of another capacitor according to an embodiment of the present disclosure.

Optionally, it is assumed that m=2 and n=2, that is, a laminated structure 130 may include two conductive layers, such as a second conductive layer 131 and a third conductive layer 132 shown in FIGS. 1 and 2, and two insulating layers, such as a third insulating layer 133 and a fourth insulating layer 134 shown in FIGS. 1 and 2.

It should be noted that the case that m=2 and n=2 is only an example. In the embodiment of the present disclosure, n may be an integer greater than or equal to 2, such as 5, 10, or the like, which is not limited in the embodiment of the present disclosure.

Optionally, as shown in FIG. 1, the second conductive layer 131 is disposed above the semiconductor substrate 110, in the first trench group 10, in the first cavity structure 30, in the second trench group 20 and in the second cavity structure 31, while the third conductive layer 132 is only disposed above the semiconductor substrate 110, in the first trench group 10 and in the second trench group 20. Specifically, the second conductive layer 131 is disposed above the semiconductor substrate 110, in the first trench group 10, in the first cavity structure 30, in the second trench group 20 and in the second cavity structure 31; the third insulating layer 133 is disposed between the semiconductor substrate 110 and the second conductive layer 131 to isolate the second conductive layer 131 from the semiconductor substrate 110; the third conductive layer 132 is disposed above the semiconductor substrate 110, in the first trench group 10 and in the second trench group 20; and the fourth insulating layer 134 is disposed between the second conductive layer 131 and the third conductive layer 132 to isolate the second conductive layer 131 from the third conductive layer 132.

It should be noted that in the capacitor 100 shown in FIG. 1, the third insulating layer 133 may not be provided, that is, the second conductive layer 131 may be in direct contact with the semiconductor substrate 110.

It should be noted that, as shown in FIG. 1, the laminated structure 130 disposed in the first trench group 10 is completely independent from the laminated structure 130 disposed in the second trench group 20.

Optionally, as shown in FIG. 2, both the second conductive layer 131 and the third conductive layer 132 are disposed above the semiconductor substrate 110, in the first trench group 10, in the first cavity structure 30, in the second trench group 20 and in the second cavity structure 31. Specifically, the second conductive layer 131 is disposed above the semiconductor substrate 110, in the first trench group 10, in the first cavity structure 30, in the second trench group 20 and in the second cavity structure 31; the third insulating layer 133 is disposed between the semiconductor substrate 110 and the second conductive layer 131 to isolate the second conductive layer 131 from the semiconductor substrate 110; the third conductive layer 132 is disposed above the semiconductor substrate 110, in the first trench group 10, in the first cavity structure 30, in the second trench group 20 and in the second cavity structure 31; and the fourth insulating layer 134 is disposed between the second conductive layer 131 and the third conductive layer 132 to isolate the second conductive layer 131 from the third conductive layer 132.

It should be noted that in the capacitor 100 shown in FIG. 2, the third insulating layer 133 may not be provided, that is, the second conductive layer 131 may be in direct contact with the semiconductor substrate 110.

It should be noted that, as shown in FIG. 2, the laminated structure 130 disposed in the first trench group 10 is completely independent from the laminated structure 130 disposed in the second trench group 20.

Optionally, the capacitor 100 further includes: an etching stop layer 160 and a fifth insulating layer 170.

Specifically, as shown in FIGS. 1 and 2, the etching stop layer 160 is disposed above the semiconductor substrate 110 and the second conductive layer 132; and the fifth insulating layer 170 is disposed on an upper surface of the etching stop layer 160.

Optionally, as shown in FIGS. 1 and 2, the first electrode layer 140 and the third electrode layer 220 are a same electrode, and the second electrode layer 150 and the fourth electrode layer 230 are a same electrode. Specifically, the first electrode layer 140 (the third electrode layer 220) is disposed under the first insulating layer 120, and the first electrode layer 140 is electrically connected to the second conductive layer 131 in the first trench group 10 through the first via structure 40, and the third electrode layer 220 is electrically connected to the second conductive layer 131 in the second trench group 20 through the fifth via structure 44. Specifically, the first via structure 40 is disposed in the third insulating layer 133, and the first electrode layer 140 is disposed in the first via structure 40, so that the first electrode layer 140 is electrically connected to the second conductive layer 131 in the first trench group 10 through the first via structure 40. The fifth via structure 44 is disposed in the third insulating layer 133, and the third electrode layer 220 is disposed in the fifth via structure 44, so that the third electrode layer 220 is electrically connected to the second conductive layer 131 in the second trench group 20 through the fifth via structure 44. Of course, if the third insulating layer 133 is not provided, that is, the second conductive layer 131 is in direct contact with the semiconductor substrate 110, the first electrode layer 140 (the third electrode layer 220) may be directly electrically connected to the second conductive layer 131.

Optionally, as shown in FIGS. 1 and 2, the second electrode layer 150 (the fourth electrode layer 230) is disposed above the fifth insulating layer 170, and the second electrode layer 150 is electrically connected to the third conductive layer 132 in the first trench group 10 through the second via structure 41, and the fourth electrode layer 230 is electrically connected to the third conductive layer 132 in the second trench group 20 through the sixth via structure 45. Specifically, the second via structure 41 and the sixth via structure 45 are disposed in the fifth insulating layer 170 and penetrates through the etching stop layer 160, and the second electrode layer 150 (the fourth electrode layer 230) is disposed in the second via structure 41, so that the second electrode layer 150 is electrically connected to the third conductive layer 132 through the second via structure 41 and the sixth via structure 45.

It should be noted that the etching stop layer 160 is more resistant to etching than the fifth insulating layer 170; when the second via structure 41 and the sixth via structure 45 are etched, bottoms of the via structures are enabled to stay on the etching stop layer at different depths, and then part of the etching stop layer 160 exposed at the bottoms of the via structures is removed by a dry or wet process, so that the via structures penetrate through the etching stop layer 160. For example, a material of the fifth insulating layer 170 is silicon dioxide, and a material of the etching stop layer 160 is silicon nitride.

Therefore, setting the etching stop layer may better control an etching course to form the via structures.

Optionally, the material of the fifth insulating layer 170 may be an organic polymer material, including polyimide, parylene, benzocyclobutene (BCB), or the like; it may also be some inorganic materials, including SOG, USG, BSG, PSG, BPSG, silicon oxide synthesized by TEOS, silicon oxide, silicon nitride and ceramic; and it may also be a combination of the foregoing materials.

In a specific implementation, for example, in the capacitor 100 (n=2) shown in FIG. 1 and FIG. 2, a first trench group 10 and a second trench group 20 are provided; in the first trench group 10, the second conductive layer 131, the fourth insulating layer 134 and the third conductive layer 132 may constitute a capacitor A (capacitance C1); in the second trench group 20, the second conductive layer 131, the fourth insulating layer 134 and the third conductive layer 132 may constitute a capacitor B (capacitance C2), and the capacitor A and the capacitor B are connected in parallel. Therefore, capacitance C of the capacitor 100 may be C=C1+C2.

Optionally, in some embodiments, the first electrode layer 140 is also electrically connected to the semiconductor substrate 110. That is, the first electrode layer 140 is electrically connected to all the odd-numbered conductive layer(s) in the n conductive layers disposed in the first trench group 10 and the semiconductor substrate 110.

Optionally, the first electrode layer 140 is electrically connected to the semiconductor substrate 110 through at least one third via structure. Of course, the first electrode layer 140 may also be directly electrically connected to the semiconductor substrate 110.

Optionally, in some embodiments, the third electrode layer 220 is also electrically connected to the semiconductor substrate 110. That is, the third electrode layer 220 is electrically connected to all odd-numbered conductive layer(s) in the n conductive layers disposed in the second trench group 20 and the semiconductor substrate 110.

Optionally, the third electrode layer 220 is electrically connected to the semiconductor substrate 110 through at least one third via structure. Of course, the third electrode layer 220 may also be directly electrically connected to the semiconductor substrate 110.

Figure 3:
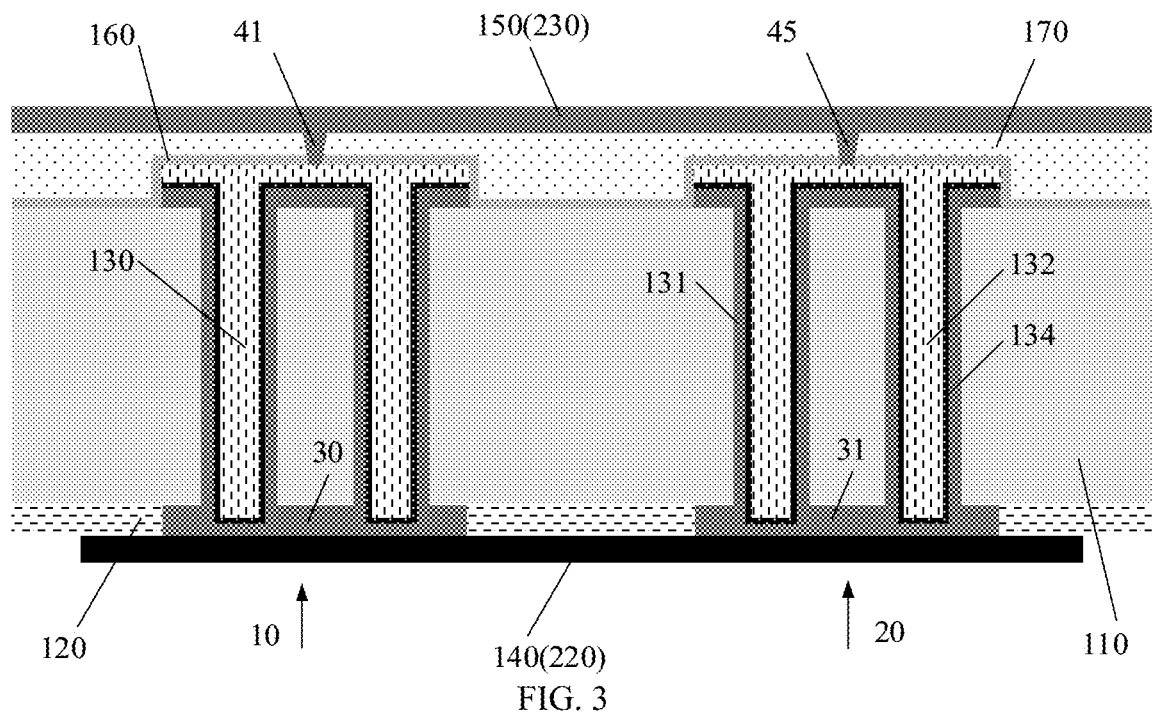
FIG. 3 is a schematic structural diagram of another capacitor according to an embodiment of the present disclosure.
Figure 4:
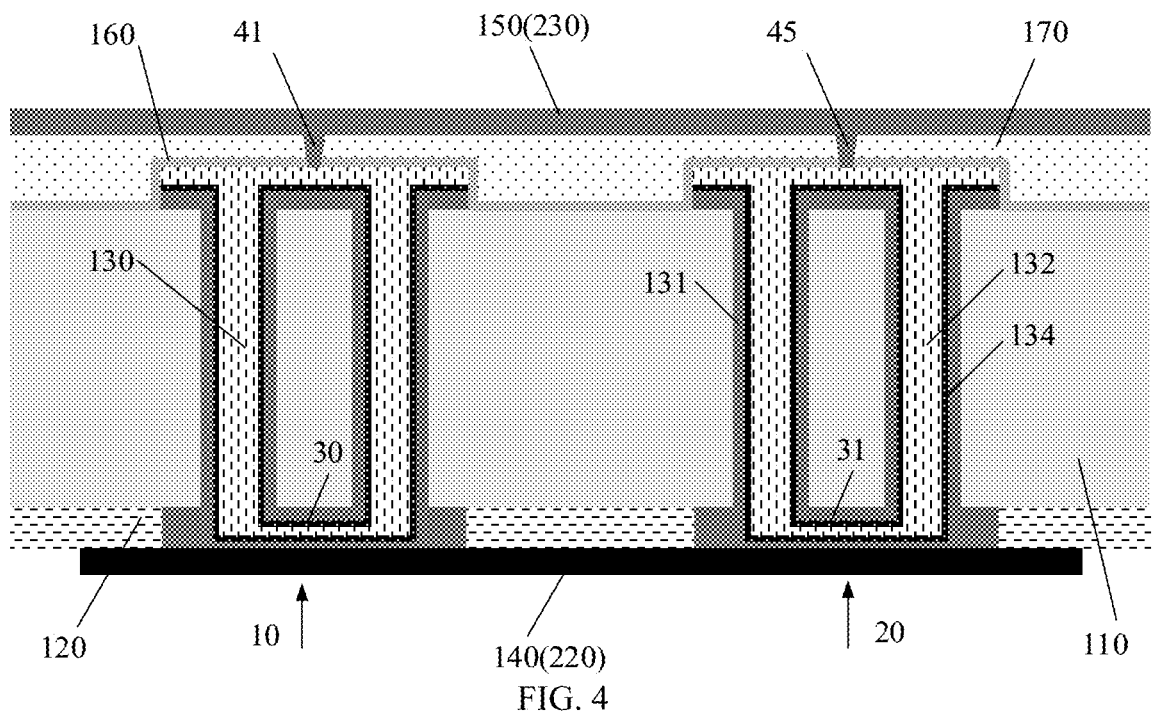
FIG. 4 is a schematic structural diagram of yet another capacitor according to an embodiment of the present disclosure.

Specifically, it is assumed that m=1 and n=2, that is, a laminated structure 130 may include two conductive layers, such as a second conductive layer 131 and a third conductive layer 132 shown in FIGS. 3 and 4, and one insulating layer, such as a fourth insulating layer 134 shown in FIGS. 3 and 4. A third electrode 220 and a first electrode 140 are a same electrode and are disposed under a first insulating layer 120, and a fourth electrode 230 and a second electrode 150 are a same electrode and are disposed above a fifth insulating layer 170.

Optionally, as shown in FIG. 3, the second conductive layer 131 is disposed above a semiconductor substrate 110, in a first trench group 10, in a first cavity structure 30, in a second trench group 20 and in a second cavity structure 31, while the third conductive layer 132 is only disposed above the semiconductor substrate 110, in the first trench group 10 and in the second trench group 20. Specifically, the second conductive layer 131 is disposed above the semiconductor substrate 110, in the first trench group 10, in the first cavity structure 30, in the second trench group 20 and in the second cavity structure 31; the third conductive layer 132 is disposed above the semiconductor substrate 110, in the first trench group 10 and in the second trench group 20; and the fourth insulating layer 134 is disposed between the second conductive layer 131 and the third conductive layer 132 to isolate the second conductive layer 131 from the third conductive layer 132; furthermore, the third insulating layer 133 is not provided under the second conductive layer 131 located at a bottom of the first trench group 10 and a bottom of the first cavity structure 30, and likewise, the third insulating layer 133 is not provided under the second conductive layer 131 located at a bottom of the second trench group 20 and a bottom of the second cavity structure 31.

Optionally, as shown in FIG. 4, both the second conductive layer 131 and the third conductive layer 132 are disposed above the semiconductor substrate 110, in the first trench group 10, in the first cavity structure 30, in the second trench group 20 and in the second cavity structure 31. Specifically, the second conductive layer 131 is disposed above the semiconductor substrate 110, in the first trench group 10, in the first cavity structure 30, in the second trench group 20 and in the second cavity structure 31; the third conductive layer 132 is disposed above the semiconductor substrate 110, in the first trench group 10, in the cavity structure 30, in the second trench group 20 and in the second cavity structure 31; and the fourth insulating layer 134 is disposed between the second conductive layer 131 and the third conductive layer 132 to isolate the second conductive layer 131 from the third conductive layer 132; furthermore, the third insulating layer 133 is not provided under the second conductive layer 131 located at the bottom of the first trench group 10 and the bottom of the first cavity structure 30, and likewise, the third insulating layer 133 is not provided under the second conductive layer 131 located at the bottom of the second trench group 20 and the bottom of the second cavity structure 31.

Optionally, as shown in FIGS. 3 and 4, the first electrode layer 140 (the third electrode layer 220) is disposed under the first insulating layer 120, and the first electrode layer 140 (the third electrode layer 220) is directly electrically connected to the second conductive layer 131 and is electrically connected to the semiconductor substrate 110 through the second conductive layer 131.

Optionally, as shown in FIGS. 3 and 4, the second electrode layer 150 (the fourth electrode layer 230) is disposed above the fifth insulating layer 170, and the second electrode layer 150 is electrically connected to the third conductive layer 132 in the first trench group 10 through a second via structure 41, and the fourth electrode layer 230 is electrically connected to the third conductive layer 132 in the second trench group 20 through a sixth via structure 45. Specifically, the second via structure 41 and the sixth via structure 45 are disposed in the fifth insulating layer 170 and penetrates through an etching stop layer 160, and the second electrode layer 150 is disposed in the second via structure 41, so that the second electrode layer 150 is electrically connected to the third conductive layer 132 in the first trench group 10 through the second via structure 41; and the fourth electrode layer 230 is disposed in the sixth via structure 45, so that the second electrode layer 150 is electrically connected to the third conductive layer 132 in the second trench group 20 through the sixth via structure 45.

It should be noted that, in the capacitor 100 shown in FIGS. 3 and 4, the first electrode layer 140 is electrically connected to a conductive region with low resistivity in the semiconductor substrate 110.

In a specific implementation, in the capacitor 100 (n=2) shown in FIG. 3 and FIG. 4, a first trench group 10 and a second trench group 20 are provided; in the first trench group 10, the second conductive layer 131, the fourth insulating layer 134 and the third conductive layer 132 may constitute a capacitor A (capacitance C1); in the second trench group 20, the second conductive layer 131, the fourth insulating layer 134 and the third conductive layer 132 may constitute a capacitor B (capacitance C2), and the capacitor A and the capacitor B are connected in parallel. Therefore, capacitance C of the capacitor 100 may be C=C1+C2.

It should be understood that, except that the third insulating layer 133, the first via structure 40 and the fifth via structure 44 are not provided, and the arrangements of the via structure via structure first electrode layer 140 (the third electrode layer 220) is different, other arrangements in FIG. 3 and FIG. 1 are the same, which will not be repeatedly described for brevity. Similarly, except that the third insulating layer 133, the first via structure 40 and the fifth via structure 44 are not provided, and the arrangements of the via structure via structure first electrode layer 140 (the third electrode layer 220) is different, the other arrangements in FIG. 4 and FIG. 2 are the same, which will not be repeatedly described for brevity.

Optionally, in some embodiments, the second electrode layer 150 is also electrically connected to the semiconductor substrate 110. That is, the second electrode layer 150 is electrically connected to all even-numbered conductive layer(s) in the n conductive layers and the semiconductor substrate 110.

Optionally, the second electrode layer 150 is electrically connected to the semiconductor substrate 110 through at least one fourth via structure 43. Of course, the second electrode layer 150 may also be directly electrically connected to the semiconductor substrate 110.

Optionally, in some embodiments, the fourth electrode layer 230 is also electrically connected to the semiconductor substrate 110. That is, the fourth electrode layer 230 is electrically connected to all even-numbered conductive layer(s) in the n conductive layers disposed in the second trench group 20 and the semiconductor substrate 110.

Optionally, the fourth electrode layer 230 is electrically connected to the semiconductor substrate 110 through at least one fourth via structure 43. Of course, the fourth electrode layer 230 may also be directly electrically connected to the semiconductor substrate 110.

Figure 5:
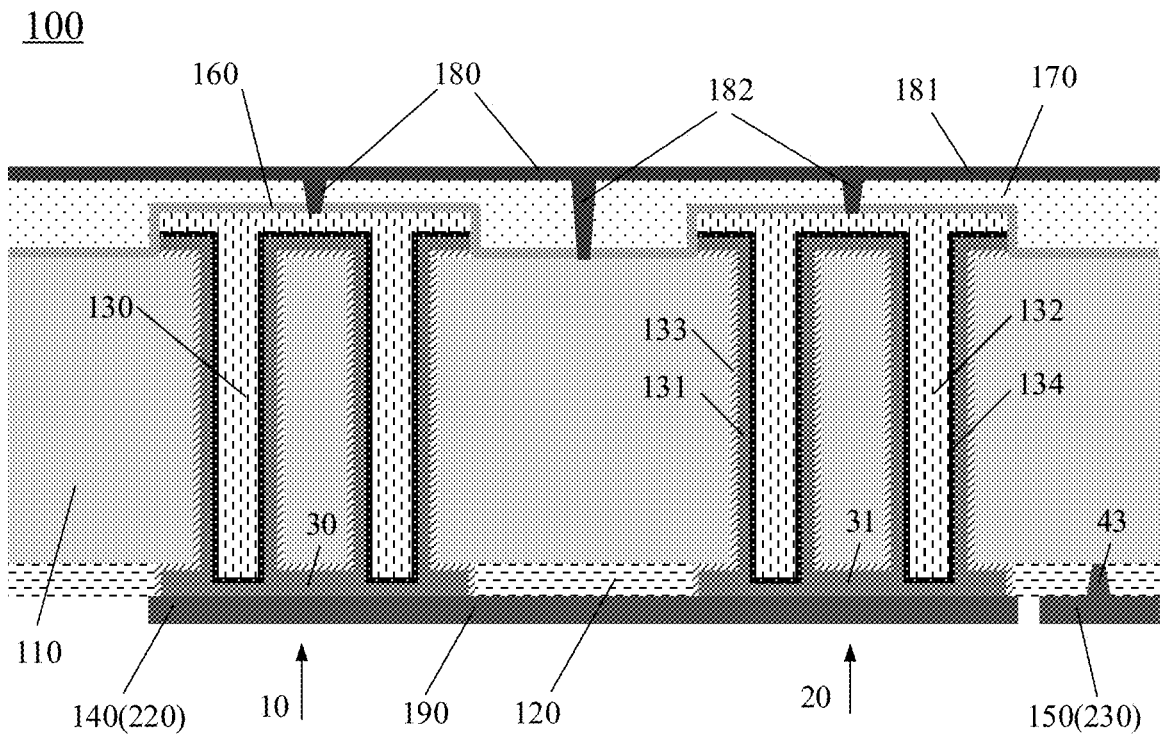
FIG. 5 is a schematic structural diagram of yet another capacitor according to an embodiment of the present disclosure.

Optionally, it is assumed that m=2 and n=2, that is, a laminated structure 130 may include two conductive layers, such as a second conductive layer 131 and a third conductive layer 132 shown in FIG. 5, and two insulating layers, such as a third insulating layer 133 and a fourth insulating layer 134 shown in FIG. 5. A third electrode 220 and a first electrode 140 are a same electrode and are disposed under a first insulating layer 120, and a fourth electrode 230 and a second electrode 150 are a same electrode and are disposed under the first insulating layer 120.

Optionally, as shown in FIG. 5, the second conductive layer 131 is disposed above a semiconductor substrate 110, in a first trench group 10, in a first cavity structure 30, in a second trench group 20 and in a second cavity structure 31, while the third conductive layer 132 is only disposed above the semiconductor substrate 110, in the first trench group 10 and in the second trench group 20. Specifically, the second conductive layer 131 is disposed above the semiconductor substrate 110, in the first trench group 10, in the first cavity structure 30, in the second trench group 20 and in the second cavity structure 31; the third insulating layer 133 is disposed between the semiconductor substrate 110 and the second conductive layer 131 to isolate the second conductive layer 131 from the semiconductor substrate 110; the third conductive layer 132 is disposed above the semiconductor substrate 110, in the first trench group 10 and in the second trench group 20; and the fourth insulating layer 134 is disposed between the second conductive layer 131 and the third conductive layer 132 to isolate the second conductive layer 131 from the third conductive layer 132; furthermore, the third insulating layer 133 is not provided under the second conductive layer 131 located at a bottom of the first trench group 10 and a bottom of the first cavity structure 30, and likewise, the third insulating layer 133 is not provided under the second conductive layer 131 located at a bottom of the second trench group 20 and a bottom of the second cavity structure 31.

It should be noted that the third insulating layer 133 is not disposed under the second conductive layer 131 located at the bottom of the first trench group 10 and the bottom of the first cavity structure 30, and the first electrode layer 140 disposed under the first insulating layer 120 may be directly electrically connected to the second conductive layer 131 located in the first trench group 10, which saves a step of etching a first via structure 40 in the third insulating layer 133, thus simplifying a process of fabricating a capacitor. Similarly, the third insulating layer 133 is not disposed under the second conductive layer 131 located at the bottom of the second trench group 20 and the bottom of the second cavity structure 31, and the third electrode layer 220 disposed under the first insulating layer 120 may be directly electrically connected to the second conductive layer 131 located in the second trench group 20, which saves a step of etching a fifth via structure 44 in the third insulating layer 133, thus simplifying a process of fabricating a capacitor.

Optionally, as shown in FIG. 5, the capacitor 100 further includes an interconnection structure 180. Specifically, the interconnection structure 180 includes a first metal layer 181 disposed on an upper surface of a fifth insulating layer 170 and at least two conductive channels 182 disposed in the fifth insulating layer 170, and the at least two conductive channels 182 penetrate through an etching stop layer 160, and one part of the at least two conductive channels 182 is connected to the third conductive layer 132 and the other part thereof is connected to the semiconductor substrate 110. In other words, the interconnection structure 180 electrically connects the third conductive layer 132 and the semiconductor substrate 110 through the at least two conductive channels 182.

It should be noted that the etching stop layer 160 is more resistant to etching than the fifth insulating layer 170; when the at least two conductive channels 182 are etched, bottoms of the conductive channels 182 are enabled to stay on the etching stop layer at different depths, and then part of the etching stop layer 160 exposed at the bottoms of the conductive channels 182 is removed by a dry or wet process, so that the at least two conductive channels 182 penetrate through the etching stop layer 160. For example, a material of the fifth insulating layer 170 is silicon dioxide, and a material of the etching stop layer 160 is silicon nitride.

Therefore, setting the etching stop layer may better control an etching course to form the at least two conductive channels.

Optionally, a material of the first metal layer 181 may adopt various conductive metal materials, such as copper.

Optionally, a material of the conductive channels 182 may adopt various conductive metal materials, such as tungsten.

Optionally, as shown in FIG. 5, the second electrode layer 150 (the fourth electrode layer 230) may be electrically connected to the third conductive layer 132 through the semiconductor substrate 110 electrically connected to the third conductive layer 132. In other words, the second electrode layer 150 (the fourth electrode layer 230) is electrically connected to the semiconductor substrate 110, and the semiconductor substrate 110 is electrically connected to the third conductive layer 132, that is, the second electrode layer 150 (the fourth electrode layer 230) is electrically connected to the third conductive layer 132.

Optionally, as shown in FIG. 5, the first electrode layer 140 (the third electrode layer 220) and the second electrode layer 150 (the fourth electrode layer 230) are directly disposed under the first insulating layer 120. Specifically, the capacitor 100 further includes a first conductive layer 190. The first conductive layer 190 is disposed under the first insulating layer 120, and includes a first conductive region and a second conductive region separated from each other; and the first conductive region forms the first electrode layer 140 (the third electrode layer 220) and the second conductive region forms the second electrode layer 150 (the fourth electrode layer 230). That is, the first electrode layer 140 (the third electrode layer 220) and the second electrode layer 150 (the fourth electrode layer 230) may be formed by one etching process, which reduces the etching steps.

Optionally, the first conductive layer 190 includes at least one of the following layers:

a heavily doped polysilicon layer, a carbon-based material layer, a metal layer, a titanium nitride layer and a tantalum nitride layer.

Optionally, the foregoing metal layer may be at least one of an aluminum (Al) layer, a tungsten (W) layer, a copper (Cu) layer, a titanium (Ti) layer, a tantalum (Ta) layer, a platinum (Pt) layer, a ruthenium (Ru) layer, a iridium (Ir) layer and a rhodium (Rh) layer.

Optionally, the first conductive region and the second conductive region are isolated by air. Of course, they may also be isolated by some insulating materials. Meanwhile, the spacing between the first conductive region and the second conductive region may be flexibly set according to actual needs, which is not limited in the embodiment of the present disclosure.

Optionally, as shown in FIG. 5, the first electrode layer 140 (the third electrode layer 220) is directly electrically connected to the second conductive layer 131, and the second electrode layer 150 (the fourth electrode layer 230) is electrically connected to the semiconductor substrate 110 through at least one fourth via structure 43. Specifically, the at least one fourth via structure 43 is disposed in the first insulating layer 120 and is formed upward from a lower surface of the first insulating layer 120 to expose the semiconductor substrate 110, and the first conductive layer 190 is disposed in the fourth via structure 43 to electrically connect the second electrode layer 150 to the semiconductor substrate 110.

It should be noted that the second electrode layer 150 (the fourth electrode layer 230) is electrically connected to a conductive region with low resistivity in the semiconductor substrate 110.

Optionally, in some embodiments, the first electrode layer 140 (the third electrode layer 220) and the second electrode layer 150 (the fourth electrode layer 230) are disposed below the first insulating layer 120, but not directly disposed under the first insulating layer 120. Specifically, the capacitor 100 further includes a base 200 and a second insulating layer 210.

Figure 6:
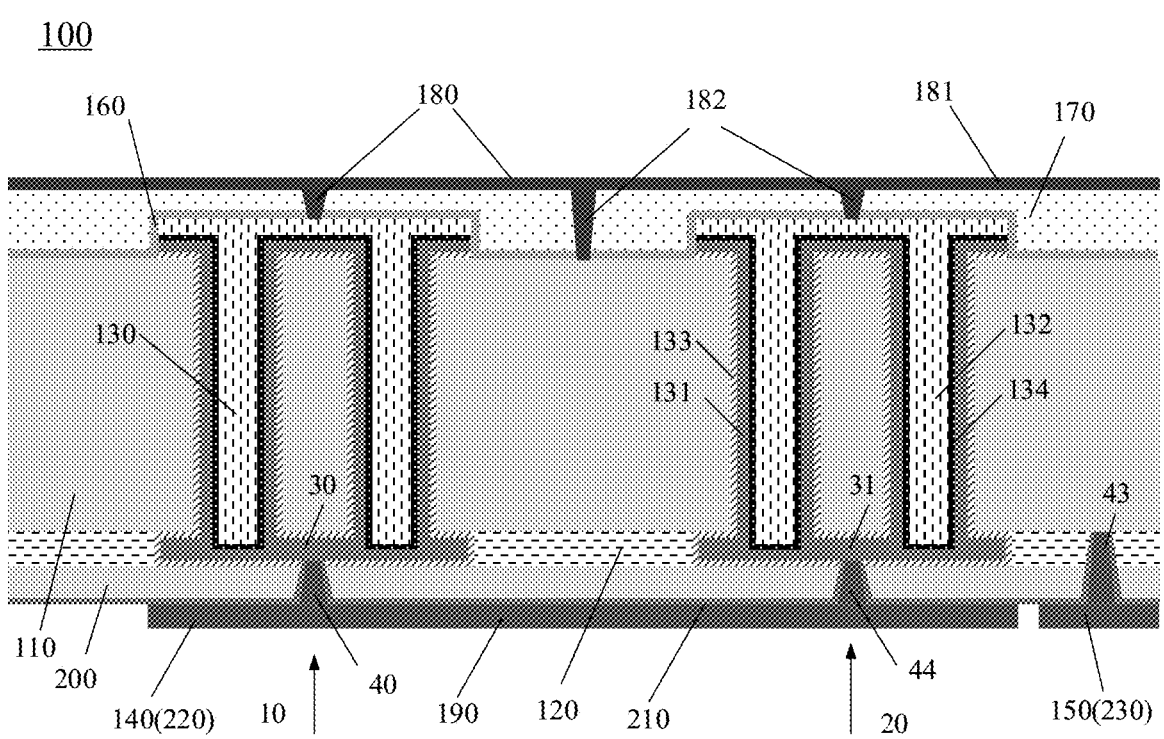
FIG. 6 is a schematic structural diagram of yet another capacitor according to an embodiment of the present disclosure.

Specifically, as shown in FIG. 6, the base 200 is disposed between the first insulating layer 120 and the first conductive layer 190, and the base 200 together with the semiconductor substrate 110 and the first insulating layer 120 forms an SOI substrate; and the second insulating layer 210 is disposed between the first conductive layer 190 and the base 200 to isolate the first conductive layer 190 from the base 200. Furthermore, the first electrode layer 140 is electrically connected to the second conductive layer 131 in the first trench group 10 through at least one first via structure 40, the third electrode layer 220 is electrically connected to the second conductive layer 131 in the second trench group 20 through at least one fifth via structure 44, and the second electrode layer 150 (the fourth electrode layer 230) is electrically connected to the semiconductor substrate 110 through at least one fourth via structure 43.

Optionally, as shown in FIG. 6, the at least one first via structure 40 is disposed in the base 200 and formed upward from a lower surface of the base 200 to expose the second conductive layer 131 in the first trench group 10, and the first conductive layer 190 is disposed in the first via structure 40, so that the first electrode layer 140 is electrically connected to the second conductive layer 131 located in the first trench group 10. The at least one fifth via structure 44 is disposed in the base 200 and formed upward from the lower surface of the base 200 to expose the second conductive layer 131 located in the second trench group 20, and the first conductive layer 190 is disposed in the fifth via structure 44, so that the third electrode layer 220 is electrically connected to the second conductive layer 131 located in the first trench group 10. The at least one fourth via structure 43 is disposed in the base 200 and the first insulating layer 120, and formed upward from the lower surface of the base 200 to expose the semiconductor substrate 110, and the first conductive layer 190 is disposed in the fourth via structure 43, so that the second electrode layer 150 (the fourth electrode layer 230) is electrically connected to the semiconductor substrate 110.

It should be understood that, except for different arrangements of the base 200, the second insulating layer 210, the first via structure 40, the fifth via structure 44 and the fourth via structure 43, other arrangements in FIG. 6 and FIG. 5 are the same, which will not be repeatedly described for brevity.

Optionally, a material of the second insulating layer 210 may be an organic polymer material, including polyimide, parylene, benzocyclobutene (BCB), or the like; it may also be some inorganic materials, including SOG, USG, BSG, PSG, BPSG, silicon oxide synthesized by TEOS, silicon oxide, silicon nitride and ceramic; and it may also be a combination of the foregoing materials.

Figure 7:
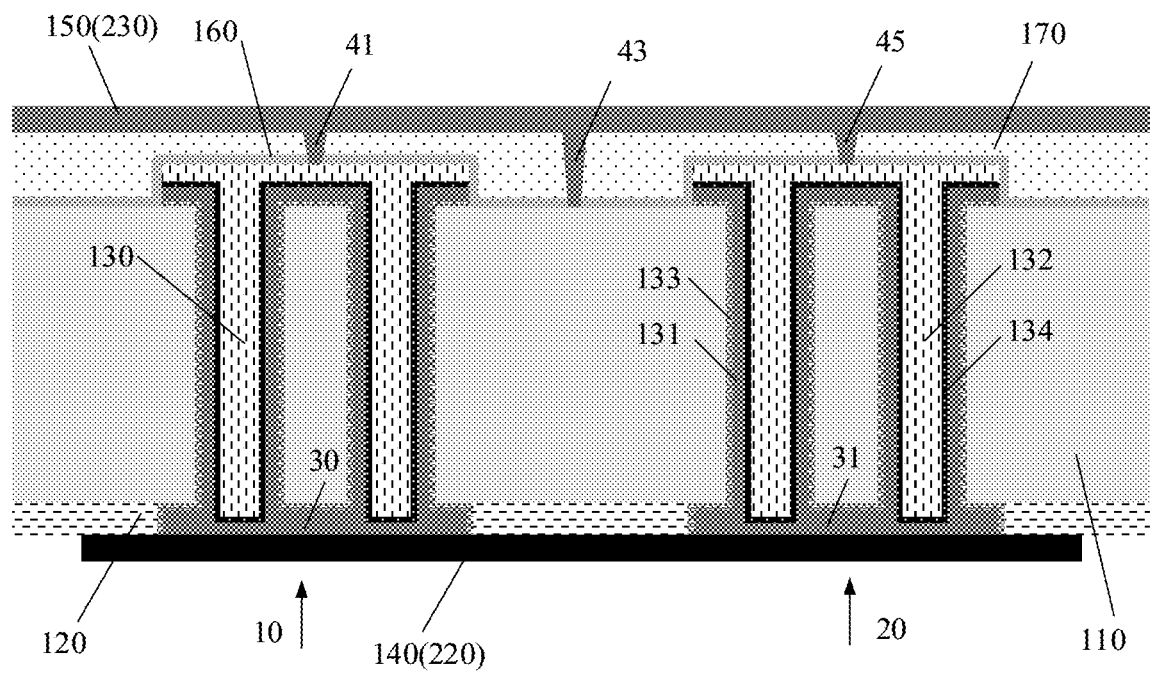
FIG. 7 is a schematic structural diagram of yet another capacitor according to an embodiment of the present disclosure.

Optionally, in some embodiments, as shown in FIG. 7, a first electrode layer 140 (a third electrode layer 220) is disposed under a first insulating layer 120, and a second electrode layer 150 (a fourth electrode layer 230) is disposed above a fifth insulating layer 170; and the first electrode layer 140 (the third electrode layer 220) is directly electrically connected to a second conductive layer 131; the second electrode layer 150 is electrically connected to a third conductive layer 132 in a first trench group 10 through a second via structure 41, the fourth electrode layer 230 is electrically connected to the third conductive layer 132 in a second trench group 20 through a sixth via structure 45, and the second electrode layer 150 (the fourth electrode layer 230) is electrically connected to a semiconductor substrate 110 through a fourth via structure 43.

It should be understood that except for different arrangements of the first electrode layer and the second electrode layer, other arrangements of the capacitor shown in FIG. 7 is the same as that of the capacitor shown in FIG. 3, which will not repeatedly described here.

Figure 8:
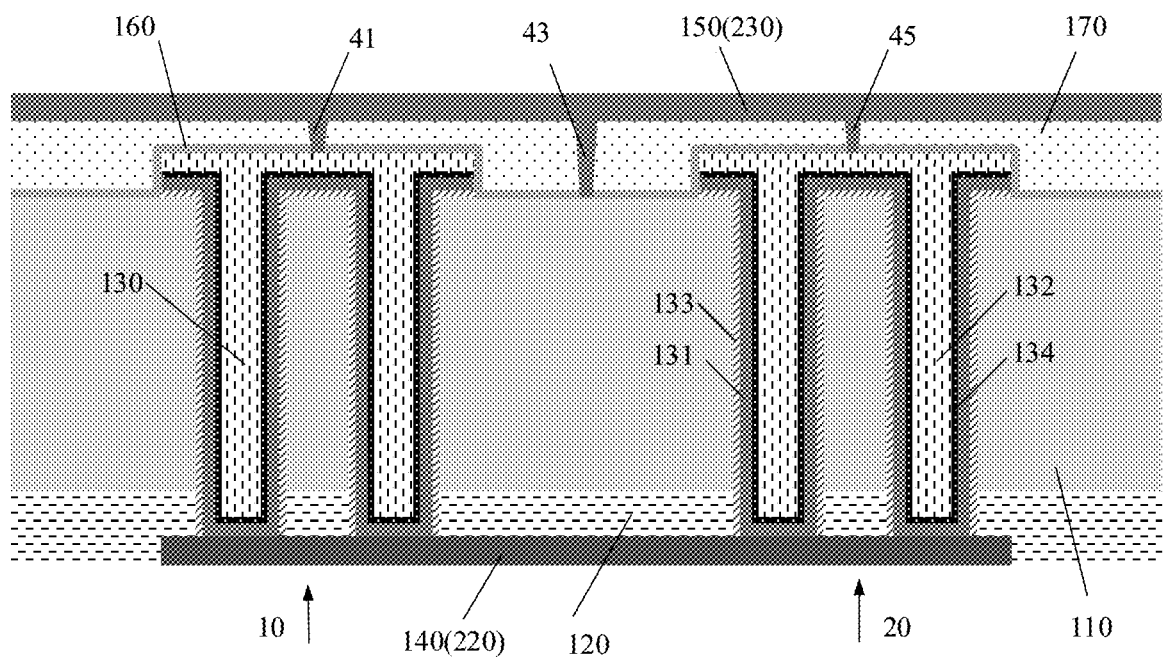
FIG. 8 is a schematic structural diagram of yet another capacitor according to an embodiment of the present disclosure.

Optionally, in some embodiments, as shown in FIG. 8, bottoms of at least two trenches included in a first trench group 10 are not communicated, and a cavity structure 30 located in a first insulating layer 120 is not formed between the at least two trenches. Instead, the bottoms of the at least two trenches are directly connected through a first electrode layer 140, thereby achieving the purpose of electrically connecting the first electrode layer 140 to a second conductive layer 131.

Specifically, as shown in FIG. 8, the first electrode layer 140 (a third electrode layer 220) is disposed under a first trench group 10 and a second trench group 20, is disposed in the first insulating layer 120, and is directly electrically connected to the second conductive layer 131. A second electrode layer 150 (a fourth electrode layer 230) is disposed above a fifth insulating layer 170, the second electrode layer 150 is electrically connected to a third conductive layer 132 in the first trench group 10 through a second via structure 41, the fourth electrode layer 230 is electrically connected to the third conductive layer 132 in the second trench group 20 through a sixth via structure 45, and the second electrode layer 150 (the fourth electrode layer 230) is electrically connected to a semiconductor substrate 110 through a fourth via structure 43.

In a specific implementation, in the capacitor 100 (n=2) shown in FIGS. 5 to 8, a first trench group 10 and a second trench group 20 are provided; in the first trench group 10, the semiconductor substrate 110, the third insulating layer 133 and the second conductive layer 131 may constitute a capacitor A (capacitance C1), the second conductive layer 131, the fourth insulating layer 134 and the third conductive layer may constitute a capacitor B (capacitance C2), where the capacitor A and the capacitor B are connected in parallel, and equivalent capacitance of the capacitor A and the capacitor B in parallel is Ci=C1+C2; and in the second trench group 20, the semiconductor substrate 110, the third insulating layer 133 and the second conductive layer 131 may constitute a capacitor C (capacitance C3), and the second conductive layer 131, the fourth insulating layer 134 and the third conductive layer 132 may constitute a capacitor D (capacitance C4), where the capacitor C and the capacitor D are connected in parallel, and equivalent capacitance of the capacitor C and the capacitor D in parallel is Cj=C3+C4. Therefore, capacitance C of the capacitor 100 may be capacitance of the equivalent capacitance Ci and the equivalent capacitance Cj in parallel, that is, C=Ci+Cj.

Optionally, in the embodiment of the present disclosure, the laminated structure 130 disposed in the first trench group 10 and the laminated structure 130 disposed in the second trench group 20 may be different, that is, the laminated structure 130 disposed in the first trench group 10 and the laminated structure 130 disposed in the second trench group 20 may correspond to different values of m and n.

Therefore, in the capacitor provided by the embodiment of the present disclosure, a laminated structure that a conductive layer and an insulating layer are alternately stacked is adopted and is disposed above the semiconductor substrate, in the trench groups and in the cavity structures, so that a larger capacitance value may be obtained under the condition of a smaller device size, and thus capacitance density of the capacitor could be improved.

The capacitor of the embodiment of the present disclosure is described above, and a method for fabricating a capacitor of an embodiment of the present disclosure will be described below. The method for fabricating the capacitor of the embodiment of the present disclosure may fabricate the capacitor of the foregoing embodiment of the present disclosure, and the related descriptions in the following embodiments and the foregoing embodiments may be referred to each other.

Hereinafter, a method for fabricating a capacitor according to an embodiment of the present disclosure will be introduced in detail with reference to FIGS. 9 to 12.

It should be understood that FIGS. 9 and 12 are schematic flow charts of a method for fabricating a capacitor according to an embodiment of the present disclosure, but these steps or operations are merely examples, and other operations or variations of various operations in FIGS. 9 and 12 may also be performed in the embodiment of the present disclosure.

FIG. 9 illustrates a schematic flow chart of a method 300 for fabricating a capacitor according to an embodiment of the present disclosure. It should be understood that FIG. 9 is described by an example of etching a first trench group 10 and a second trench group 20 at the same time, fabricating a laminated structure 130 in the first trench group 10 and the second trench group 20, and fabricating a first electrode 140, a second electrode 150, a third electrode 220 and a fourth electrode 230 at the same time. Of course, in the embodiment of the application, it is also possible to only etch the first trench group 10, fabricate the laminated structure 130 in the first trench group 10, and fabricate the first electrode 140 and the second electrode 150, a specific fabrication method only needs to omit the related description about the second trench group 20 and an electrode corresponding to the second trench group 20 in the method 300.

Specifically, as shown in FIG. 9, the method 300 for fabricating the capacitor includes:

step 301, an SOI substrate is provided, where the SOI substrate includes a semiconductor substrate, a first insulating layer and a base, and the first insulating layer is disposed between the semiconductor substrate and the base.

Optionally, the SOI substrate may be as shown in FIG. 10a or as shown in FIG. 10b.

It should be noted that in the SOI substrate as shown in FIG. 10b, a first cavity structure 30 and a second cavity structure 31 need to be prefabricated in the SOI substrate, that is, part of a first insulating layer 120 sinks so that the first cavity structure 30 and the second cavity structure 31 are formed between the first insulating layer 120 and a semiconductor substrate 110.

It should be understood that the number of prefabricated cavity structures in the SOI substrate is correlated with the number of trench groups to be fabricated, for example, one trench group corresponds to one cavity structure.

Step 302, a first trench group and a second trench group are fabricated on the SOI substrate, where the first trench group includes at least two first trenches which penetrate through the semiconductor substrate downward from an upper surface of the semiconductor substrate and enter the first insulating layer, and bottoms of the at least two first trenches are communicated to form a first cavity structure located in the first insulating layer; and the second trench group includes at least two second trenches which penetrate through the semiconductor substrate downward from the upper surface of the semiconductor substrate and enter the first insulating layer, and bottoms of the at least two second trenches are communicated to form a second cavity structure located in the first insulating layer.

Optionally, the SOI substrate may be etched according to deep reactive ion etch to form a first trench group 10 and a second trench group 20 in the SOI substrate.

Figure 10C:
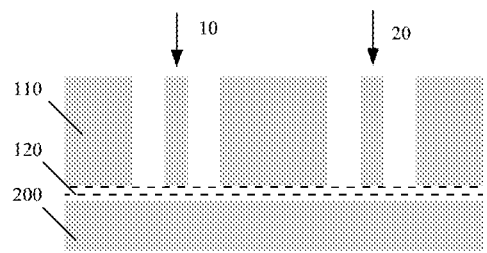
FIGS. 10a to 10u are schematic diagrams of a method for fabricating a capacitor according to an embodiment of the present disclosure.

Specifically, it is assumed that the SOI substrate as shown in FIG. 10a is provided, first, a layer of photoresist is spin-coated on an upper surface (front side) of the semiconductor substrate 110 as shown in FIG. 10a, and after exposure and development, an etched pattern window that is not covered with the photoresist is formed. Next, a first trench group 10 and a second trench group 20 are fabricated in the semiconductor substrate 110 and the first insulating layer 120 by deep reactive ion etch, as shown in FIG. 10c.

Figure 10D:
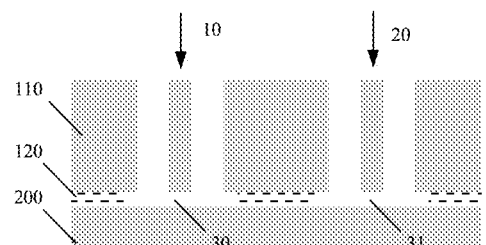

Then, part of the first insulating layer 120 exposed at the bottoms of the at least two first trenches and the bottoms of the at least two second trenches is removed to form a first cavity structure 30 communicating with the bottoms of the at least two first trenches, and to form a second cavity structure 31 communicating with the bottoms of the at least two second trenches, as shown in FIG. 10d.

Optionally, if the first insulating layer 120 is silicon dioxide, after the structure shown in FIG. 10c is obtained, gaseous hydrofluoric acid is used to pass through the first trench and the second trench to remove part of silicon dioxide at and near the bottom of the first trench and the bottom of the second trench, so as to form the first cavity structure 30 communicating the bottoms of two first trenches adjacent to each other and form the second cavity structure 31 communicating the bottoms of two second trenches adjacent to each other, as shown in FIG. 10d.

Figure 10E:
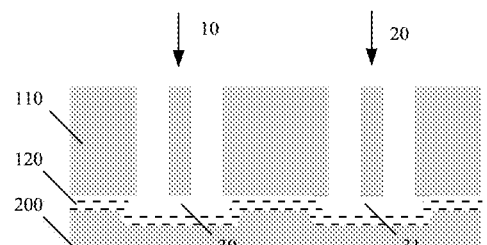

Specifically, it is assumed that the SOI substrate as shown in FIG. 10b is provided, first, a layer of photoresist is spin-coated on an upper surface (front side) of the semiconductor substrate 110 as shown in FIG. 10b, and after exposure and development, an etched pattern window that is not covered with the photoresist is formed. Next, a first trench group 10 and a second trench group 20 are fabricated in the semiconductor substrate 110 and the first insulating layer 120 by deep reactive ion etch, as shown in FIG. 10e.

It should be noted that when the SOI substrate as shown in FIG. 10b is used, the step of removing the part of the first insulating layer 120 exposed at the bottoms of the first trench and the second trench to form the first cavity structure 30 and the second cavity structure 31 may be saved, thus reducing the process difficulty.

It should be understood that after the first trench group 10 and the second trench group 20 are etched, the photoresist needs to be removed.

Specifically, the following steps are explained by taking the SOI substrate shown in FIG. 10a as an example, in other words, by taking the structure shown in FIG. 10d obtained in step 302 as an example.

Step 303, a laminated structure is fabricated above the semiconductor substrate, in the first trench group, in the first cavity structure, in the second trench group, and in the second cavity structure, where the laminated structure includes m insulating layer(s) and n conductive layers, and the m insulating layer(s) and the n conductive layers form a structure that a conductive layer and an insulating layer are adjacent to each other, so that corresponding insulating layer(s) in the m insulating layer(s) electrically isolates the n conductive layers from each other, and m and n are positive integers.

It should be noted that there is no electrically connected conductive layer between the laminated structure located in the second trench group and the laminated structure located in the first trench group.

Optionally, part or all of the n conductive layers are disposed in the first cavity structure 30 and/or the second cavity structure 31.

Optionally, the laminated structure 130 includes: a second conductive layer 131, a third insulating layer 133, a third conductive layer 132 and a fourth insulating layer 134.

Figure 10F:
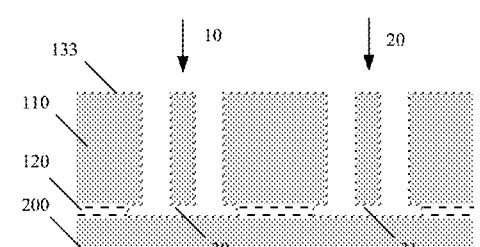
Figure 10G:
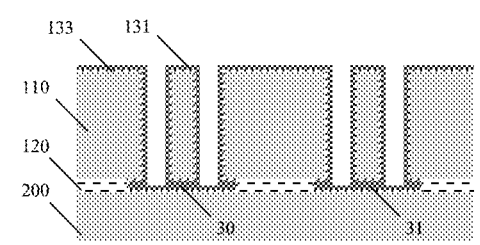
Figure 10H:
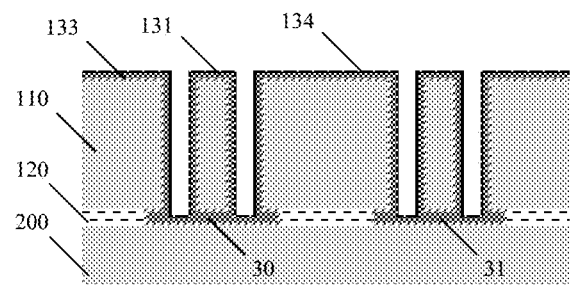
Figure 10I:
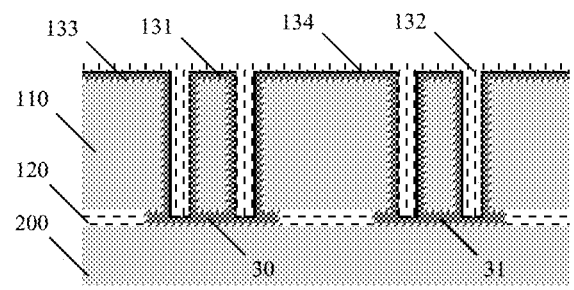
Figure 10J:
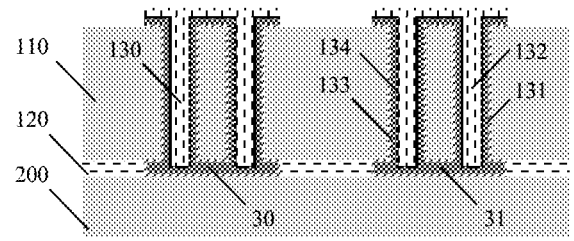

Specifically, first, in the structure shown in FIG. 10d, an insulating material is deposited on an upper surface of the semiconductor substrate 110, an inner surface of the first trench group 10, an inner surface of the first cavity structure 30, an inner surface of the second trench group 20 and an inner surface of the second cavity structure 31 to form a third insulating layer 133, as shown in FIG. 10f. Next, a conductive material is deposited on an upper surface and an inner surface of the third insulating layer 133 to form a second conductive layer 131, as shown in FIG. 10g. Then, an insulating material is deposited on an upper surface and an inner surface of the second conductive layer 131 and the upper surface of the semiconductor substrate 110 to form a fourth insulating layer 134, as shown in FIG. 10h. Then, a conductive material is deposited on an upper surface and an inner surface of the fourth insulating layer 134 and the upper surface of the semiconductor substrate 110 to form a third conductive layer 132, as shown in FIG. 10i. Finally, photolithography is performed on the third insulating layer 133, the second conductive layer 131, the fourth insulating layer 134 and the third conductive layer 132 to expose the upper surface of the semiconductor substrate 110, as shown in FIG. 10j.

It should be noted that when the photolithography is performed on the third insulating layer 133, the second conductive layer 131, the fourth insulating layer 134 and the third conductive layer 132, the following operations may be specifically included.

First, an upper surface of a structure shown in FIG. 10i is covered with a photosensitive dry film, and after exposure and development, a dry film protection layer covering the third conductive layer 132 is formed. Then, the third insulating layer 133, the second conductive layer 131, the fourth insulating layer 134 and the third conductive layer 132 that are not covered with the photosensitive dry film are removed by dry etching. Finally, the photosensitive dry film is removed to obtain patterns of the third insulating layer 133, the second conductive layer 131, the fourth insulating layer 134 and the third conductive layer 132, as shown in FIG. 10j. In this step, the patterns of the third insulating layer 133, the second conductive layer 131, the fourth insulating layer 134 and the third conductive layer 132 required remain, and excess portions of the third insulating layer 133, the second conductive layer 131, the fourth insulating layer 134 and the third conductive layer 132 are removed to expose the upper surface of the semiconductor substrate 110. It should be understood that the pattern shapes of the third insulating layer 133, the second conductive layer 131, the fourth insulating layer 134 and the third conductive layer 132 remained may be designed according to capacitance specification requirements, and description will not be elaborated here.

In the above operation of depositing the third insulating layer 133, for example, the deposition may be performed by thermal oxidation, atomic layer deposition (ALD), chemical vapor deposition (CVD), or the like.

Optionally, the third insulating layer 133 and/or the fourth insulating layer 134 includes at least one of a silicon oxide layer, a silicon nitride layer, a silicon oxynitride layer, a metal oxide layer, a metal nitride layer and a metal oxynitride layer. A material of the third insulating layer 133 and/or the fourth insulating layer 134 may be silicon oxide, silicon nitride, silicon oxynitride, metal oxide, metal nitride and metal oxynitride, or the like, such as silicon dioxide, silicon nitride, silicon oxynitride, or high dielectric constant materials including aluminum oxide, hafnium oxide, zirconium oxide, titanium dioxide, $Y_2O_3$, $La_2O_3$, $HfSiO_4$, $LaAlO_3$, $SrTiO_3$, $LaLuO_3$, or the like; and it may also be one or a combination of the foregoing materials. A specific insulating material and a layer thickness may be adjusted according to a capacitance value, a frequency characteristic, a loss and other requirements of a capacitor. Of course, the third insulating layer 133 and/or the fourth insulating layer 134 may also include some other material layers having high dielectric constant characteristics, which is not limited in the embodiment of the present disclosure. For example, the third insulating layer 133 and/or the fourth insulating layer 134 may be a laminated layer with a material having a high dielectric constant, such as silicon dioxide/alumina/silicon dioxide ($SiO_2/Al_2O_3/SiO_2$).

In the foregoing operation of depositing the second conductive layer 131, the deposition may be performed by ALD, physical vapor deposition (PVD), organometallic chemical vapor deposition, vapor deposition, electroplating, or the like.

Optionally, the second conductive layer 131 and/or the third conductive layer 132 includes at least one of a heavily doped polysilicon layer, a carbon-based material layer, a metal layer, a titanium nitride layer and a tantalum nitride layer. The foregoing metal layer may be at least one of an aluminum (Al) layer, a tungsten (W) layer, a copper (Cu) layer, a titanium (Ti) layer, a tantalum (Ta) layer, a platinum (Pt) layer, a ruthenium (Ru) layer, a iridium (Ir) layer and a rhodium (Rh) layer.

The foregoing operation of depositing the fourth insulating layer 134 may refer to the operation of depositing the third insulating layer 133, and the foregoing operation of depositing the third conductive layer 132 may refer to the operation of depositing the second conductive layer 131, which will not be repeatedly described here.

Figure 10K:
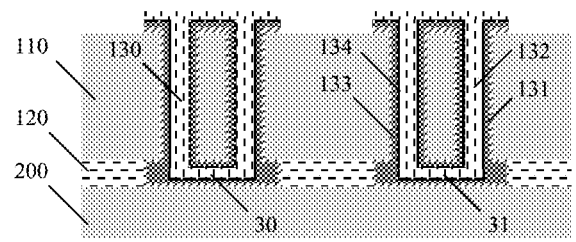

Optionally, in the foregoing step 303, a structure shown in FIG. 10k may also be fabricated; in the structure shown in FIG. 10k, both the second conductive layer 131 and the third conductive layer 132 are disposed above the semiconductor substrate 110, in the first trench group 10, in the first cavity structure 30, in the second trench group 20 and in the second cavity structure 31.

Step 304: a first electrode layer, a second electrode layer, a third electrode layer and a fourth electrode layer are fabricated, where the first electrode layer is electrically connected to all odd-numbered conductive layer(s) in the n conductive layers located in the first trench group, the second electrode layer is electrically connected to all even-numbered conductive layer(s) in the n conductive layers located in the first trench group, the third electrode layer is electrically connected to all odd-numbered conductive layer(s) in the n conductive layers located in the second trench group, and the fourth electrode layer is electrically connected to each even-numbered conductive layer in the n conductive layers located in the second trench group.

Optionally, the third electrode 220 and the first electrode 140 are a same electrode, and the fourth electrode 230 and the second electrode 150 are a same electrode. That is, an equivalent capacitor formed by the laminated structure 130 disposed in the first trench group 10 is connected in parallel with an equivalent capacitor formed by the laminated structure 130 disposed in the second trench group 20.

Optionally, the third electrode 220 and the first electrode 140 are different electrodes, and the fourth electrode 230 and the second electrode 150 are a same electrode. That is, an equivalent capacitor formed by the laminated structure 130 disposed in the first trench group 10 is connected in series with an equivalent capacitor formed by the laminated structure 130 disposed in the second trench group 20.

Optionally, the third electrode 220 and the first electrode 140 are a same electrode, and the fourth electrode 230 and the second electrode 150 are different electrodes. That is, an equivalent capacitor formed by the laminated structure 130 disposed in the first trench group 10 is connected in series with an equivalent capacitor formed by the laminated structure 130 disposed in the second trench group 20.

Optionally, the third electrode 220 and the first electrode 140 are different electrodes, and the fourth electrode 230 and the second electrode 150 are different electrodes. That is, an equivalent capacitor formed by the laminated structure 130 disposed in the first trench group 10 and an equivalent capacitor formed by the laminated structure 130 disposed in the second trench group 20 are two independent capacitors.

Specifically, the capacitor shown in FIG. 1, FIG. 3, FIG. 5, FIG. 6 and FIG. 7 may be fabricated based on the structure shown in FIG. 10j. The capacitor shown in FIG. 2 and FIG. 4 may be fabricated based on the structure shown in FIG. 10k. Of course, the capacitor with the same arrangements as those shown in FIGS. 5, 6 and 7 except for the laminated structure 130 may also be fabricated based on the structure shown in FIG. 10k.

It should be understood that the upper surfaces of respective material layers in steps 301-304 refer to a surface of the material layer substantially parallel to the upper surface of the semiconductor substrate, and the inner surfaces of respective material layers refer to an upper surface of the material layer located in the trench. The upper surface and the inner surface may be regarded as a whole.

Optionally, in an embodiment of the present disclosure, the method 300 further includes:
fabricating at least one first via structure 40, so that the first electrode layer 140 is electrically connected to all odd-numbered conductive layer(s) in the n conductive layers located in the first trench group 10 through the at least one first via structure 40.

Optionally, in an embodiment of the present disclosure, the method 300 further includes:
fabricating at least one second via structure 41, so that the second electrode layer 150 is electrically connected to all even-numbered conductive layer(s) in the n conductive layers located in the first trench group 10 through the at least one second via structure 41.

Optionally, in an embodiment of the present disclosure, the method 300 further includes:
fabricating at least one third via structure, so that the first electrode layer 140 is electrically connected to the semiconductor substrate 110 through the at least one third via structure.

Optionally, in an embodiment of the present disclosure, the method 300 further includes:
fabricating at least one fourth via structure 43, so that the second electrode layer 150 is electrically connected to the semiconductor substrate 110 through the at least one fourth via structure 43.

Optionally, a corresponding insulating layer in the m insulating layer(s) electrically isolates the n conductive layers from the semiconductor substrate 110.

Optionally, in some embodiments, the method 300 further includes:
fabricating at least one fifth via structure 44, so that the third electrode layer 220 is electrically connected to all odd-numbered conductive layer(s) in the n conductive layers located in the second trench group 20 through the at least one fifth via structure 44.

Optionally, in some embodiments, the method 300 further includes:
fabricating at least one sixth via structure 45, so that the fourth electrode layer 230 is electrically connected to all even-numbered conductive layer(s) in the n conductive layers located in the second trench group 20 through the at least one sixth via structure 45.

The fabrication of the capacitor shown in FIG. 5 and FIG. 6 will be described in detail below, and the fabrication of the capacitor shown in FIG. 1 to FIG. 4 and FIG. 7 may be completed with reference to the corresponding steps, which will not be repeatedly described here.

Optionally, in an embodiment of the present disclosure, the method 300 further includes:

depositing a fifth insulating layer 170 above the semiconductor substrate 110 and the third conductive layer 132; and fabricating an interconnection structure 180 in the fifth insulating layer 170 and on an upper surface of the fifth insulating layer 170, to electrically connect the third conductive layer 132 and the semiconductor substrate 110.

It should be noted that after the interconnection structure 180 electrically connects the third conductive layer 132 and the semiconductor substrate 110, the second electrode layer 150 (the fourth electrode layer 230) may be electrically connected to the third conductive layer 132 and the semiconductor substrate 110 only by electrically connecting to the interconnection structure 180, or the second electrode layer 150 (the fourth electrode layer 230) may be electrically connected to the third conductive layer 132 only by electrically connecting to the semiconductor substrate 110, or the second electrode layer 150 (the fourth electrode layer 230) may be electrically connected to the semiconductor substrate 110 only by electrically connecting to the third conductive layer 132.

Optionally, the interconnection structure 180 includes a first metal layer 181 disposed on an upper surface of the fifth insulating layer 170 and at least two conductive channels 182 disposed in the fifth insulating layer 170, and one part of the at least two conductive channels 182 is connected to the third conductive layer 132 and the other part thereof is connected to the semiconductor substrate 110.

Figure 10L:
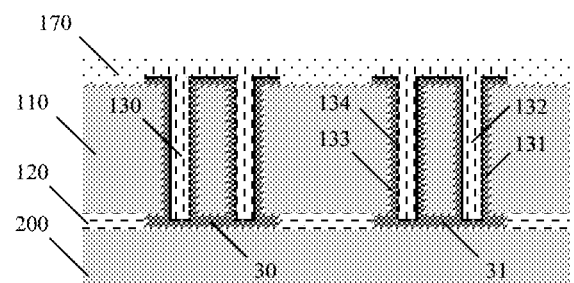
Figure 10M:
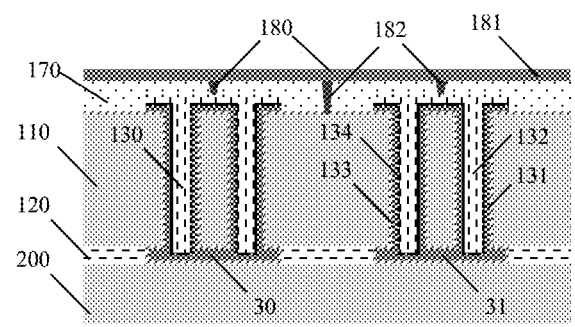

Specifically, in the structure shown in FIG. 10*j*, first, an insulating material is deposited above the semiconductor substrate 110 and the third conductive layer 132 to form the fifth insulating layer 170, as shown in FIG. 10*l*; then, the first metal layer 181 is deposited on the upper surface of the fifth insulating layer 170, and the fifth insulating layer 170 is etched by deep reactive ion etch to form at least two channels, and the semiconductor substrate 110 and/or the third conductive layer 132 are exposed in the at least two channels; and finally, a conductive material is deposited in the at least two channels to form at least two conductive channels 182, as shown in FIG. 10*m*.

It should be noted that the deposition manner of the fifth insulating layer 170 may refer to the deposition manner of the third insulating layer 133, which will not be repeatedly described here.

Optionally, a material of the fifth insulating layer 170 may be an organic polymer material, including polyimide, parylene, benzocyclobutene (BCB), or the like; it may also be some inorganic materials, including SOG, USG, BSG, PSG, BPSG, silicon oxide synthesized by TEOS, silicon oxide, silicon nitride and ceramic; and it may also be a combination of the foregoing materials.

Optionally, a material of the first metal layer 181 may adopt various conductive metal materials, such as copper.

Optionally, a material of the conductive channels 182 may adopt various conductive metal materials, such as tungsten.

Optionally, before the depositing the fifth insulating layer 170, the method 300 further includes:

depositing an etching stop layer 160 above the semiconductor substrate 110 and the third conductive layer 132. That is, the fifth insulating layer 170 is deposited above the etching stop layer 160.

Figure 10N:
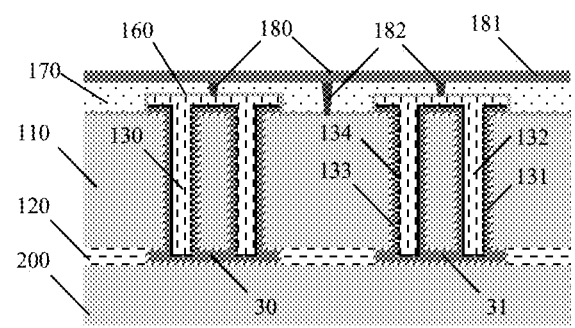

Specifically, the fifth insulating layer 170 is etched by deep reactive ion etch to form the at least two channels above the etching stop layer 160, and part of the etching stop layer 160 exposed at bottoms of the at least two channels is removed to expose the semiconductor substrate 110 and/or the third conductive layer 132, and then a conductive material is deposited in the at least two channels to form at least two conductive channels 182, as shown in FIG. 10*n*.

It should be noted that the etching stop layer 160 is more resistant to etching than the fifth insulating layer 170; when the at least two channels are etched, bottoms of the at least two channels are enabled to stay on the etching stop layer at different depths, and then part of the etching stop layer 160 exposed at the bottoms of the at least two channels is removed by a dry or wet process, so that the at least two channels penetrate through the etching stop layer 160; and then a conductive material is deposited in the at least two channels to form the at least two conductive channels 182. For example, a material of the fifth insulating layer 170 is silicon dioxide, and a material of the etching stop layer 160 is silicon nitride.

Therefore, the etching stop layer may better control an etching course to form the at least two conductive channels.

Optionally, in an embodiment of the present disclosure, the method 300 further includes:

removing the base 200 to expose the first insulating layer 120 and an insulating layer located at a bottom of the first trench group 10, a bottom of the first cavity structure 30, a bottom of the second trench group 20 and a bottom of the second cavity structure 31; and removing the insulating layer located at the bottom of the first trench group 10 and the bottom of the first cavity structure 30 to expose a conductive layer located at the bottom of the first trench group and the first cavity structure. Similarly, the insulating layer located at the bottom of the second trench group 20 and the bottom of the second cavity structure 31 is removed to expose a conductive layer located at the bottom of the second trench group and at the bottom of the second cavity structure.

Figure 10O:
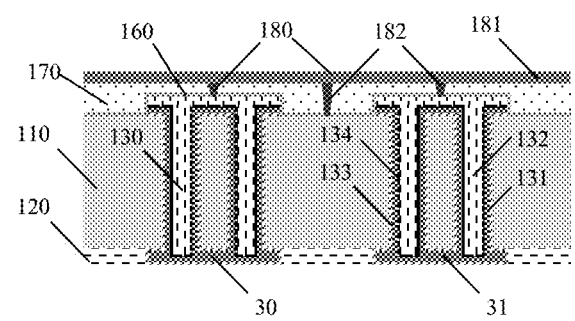
Figure 10P:
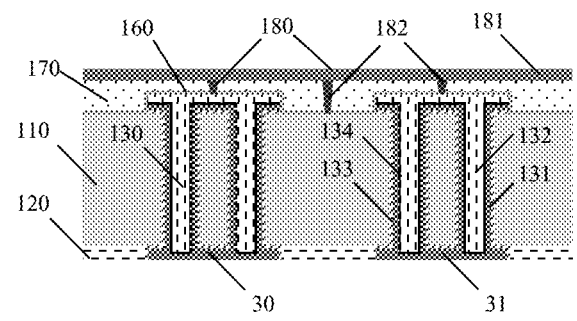

Specifically, in the structure shown in FIG. 10*n*, by using a wafer backside thinning process, the base 200 of the SOI substrate may be corroded and removed in combination with a KOH solution to expose the first insulating layer 120 and the third insulating layer 133, as shown in FIG. 10*o*; then, by using a plasma etching process, the third insulating layer 133 at the bottom of the first trench group 10 and at the bottom of the first cavity structure 30 is removed to expose the second conductive layer 131 located in the first trench group 10; and the third insulating layer 133 at the bottom of the second trench group 20 and at the bottom of the second cavity structure 31 is removed to expose the second conductive layer 131 located in the second trench group 20, as shown in FIG. 10*p*.

Optionally, as an embodiment, the foregoing step 304 may specifically include:

depositing a first conductive layer 190 under the first insulating layer 120, and etching the first conductive layer 190 to form a first conductive region and a second conductive region separated from each other, where the first conductive region forms the first electrode layer 140 (the third electrode layer 220), and the second conductive region forms the second electrode layer 150 (the fourth electrode layer 230).

Optionally, in the embodiment of the present disclosure, the method 300 further includes: etching the first insulating layer to form at least one fourth via structure, where the fourth via structure is formed upward from a lower surface of the first insulating layer to expose the semiconductor substrate, and the first conductive layer is disposed in the fourth via structure, so that the second electrode layer is electrically connected to the semiconductor substrate.

Figure 10Q:
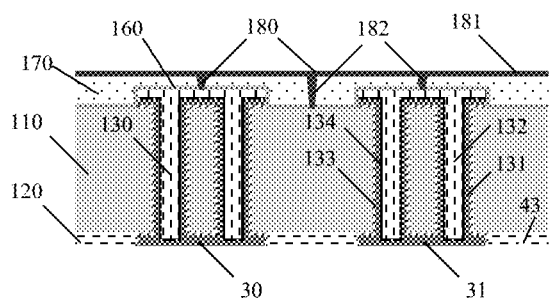
Figure 10R:
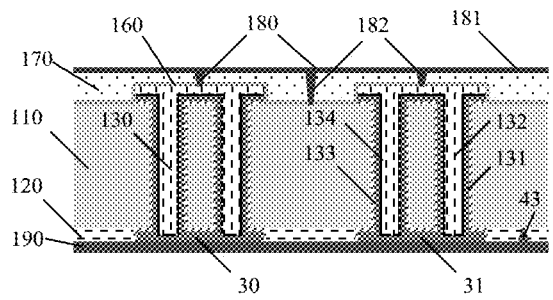

Specifically, first, in a structure shown in FIG. 10p, the first insulating layer 120 is etched by deep reactive ion etch to form at least one fourth via structure 43, and the at least one fourth via structure 43 is formed upward from the lower surface of the first insulating layer 120 to expose the semiconductor substrate 110, as shown in FIG. 10q; next, a conductive material is deposited on the lower surface of the first insulating layer 120 and in the fourth via structure 43 to form a first conductive layer 190, as shown in FIG. 10r; then, a photosensitive dry film is covered on a lower surface of the first conductive layer 190, and after exposure and development, a dry film protection layer covering the first conductive layer 190 is formed; then, the first conductive layer 190 that is not covered with the photosensitive dry film is removed by dry etching; and finally, the photosensitive dry film is removed to obtain the capacitor 100 shown in FIG. 5. It should be noted that after the dry etching, the first conductive layer 190 forms a first conductive region and a second conductive region that are separated from each other; and the first conductive region forms the first electrode layer 140 (the third electrode layer 220), and the second conductive region forms the second electrode layer 150 (the fourth electrode layer 230). Similarly, in this step, the first conductive layer 190 remains in a predetermined pattern region, and an excess portion of the first conductive layer 190 is removed to form a first conductive region and a second conductive region that are independent of each other. It should be understood that the pattern shape of the first conductive layer 190 remained may be designed according to capacitor specification requirements, and description will not be elaborated here.

It should be noted that in the foregoing step 302, when part of the first insulating layer 120 exposed at the bottoms of the first trench and the second trench is removed, there may still be part of the first insulating layer 120 that has not been removed. In other words, under the second conductive layer 131, there may still be part of the first insulating layer 120 that has not been removed, that is, there may also be a case that the first via structure 40 and the fifth via structure 44 are disposed in the part of the first insulating layer 120 that has not been removed. For example, this case may exist when a thickness of the first insulating layer 120 is greater than a certain threshold value. At this time, the first electrode layer 140 is electrically connected to the second conductive layer 131 located in the first trench group 10 through the first via structure 40, and the third electrode layer 220 is electrically connected to the second conductive layer 131 located in the second trench group 20 through the fifth via structure 44.

Optionally, in an embodiment of the present disclosure, the method 300 further includes:

etching the base 200 to form at least one first via structure 40, at least one fifth via structure 44 and at least one fourth via structure 43, where the at least one first via structure 40 is formed upward from a lower surface of the base 200 to expose the second conductive layer 131 located in the first trench group 10; the at least one fifth via structure 44 is formed upward from the lower surface of the base 200 to expose the second conductive layer 131 located in the second trench group 20; and the at least one fourth via structure 43 is formed upward from the lower surface of the base 200 to expose the semiconductor substrate 110;

depositing a second insulating layer 210 under the base 200 and on inner surfaces of the first via structure 40, the fifth via structure 44 and the fourth via structure 43;

removing the second insulating layer 210 at bottoms of the first via structure 40 and the fifth via structure 44 to expose the second conductive layer 131, and removing the second insulating layer 210 at a bottom of the fourth via structure 43 to expose the semiconductor substrate 110; and depositing a first conductive layer 190 on a lower surface and an inner surface of the second insulating layer 210.

Optionally, in the embodiment of the present disclosure, the foregoing step 304 may specifically include:

etching the first conductive layer 190 to form a first conductive region and a second conductive region separated from each other; where the first conductive region forms the first electrode layer (the third electrode layer) and the second conductive region forms the second electrode layer (the fourth electrode layer).

Figure 10S:
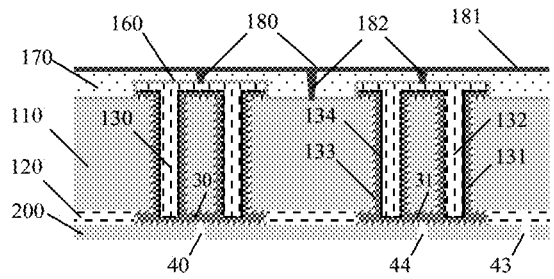
Figure 10T:
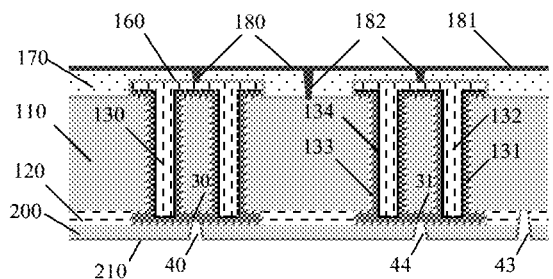
Figure 10U:
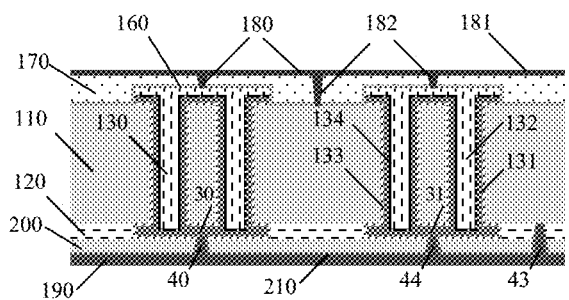

Specifically, in the structure shown in FIG. 10n, first, the base 200 is etched by deep reactive ion etch to form at least one first via structure 40, at least one fifth via structure 44 and at least one fourth via structure 43, where the at least one first via structure 40 is formed upward from the lower surface of the base 200 to expose the second conductive layer 131 located in the first trench group 10; the at least one fifth via structure 44 is formed upward from the lower surface of the base 200 to expose the second conductive layer 131 located in the second trench group 20; and the at least one fourth via structure 43 is formed upward from the lower surface of the base 200 to expose the semiconductor substrate 110, as shown in FIG. 10s. Next, a second insulating layer 210 is deposited under the base 200 and on inner surfaces of the first via structure 40, the fifth via structure 44 and the fourth via structure 43, as shown in FIG. 10t. Then, the second insulating layer 210 at the bottoms of the first via structure 40 and the fifth via structure 44 is removed to expose the second conductive layer 131, and the second insulating layer 210 at the bottom of the fourth via structure 43 is removed to expose the semiconductor substrate 110. Then, a conductive material is deposited on a lower surface and an inner surface of the second insulating layer 210 to form the first conductive layer 190, as shown in FIG. 10u. Then, a photosensitive dry film is coated on the lower surface of the first conductive layer 190, and after exposure and development, a dry film protection layer covering the first conductive layer 190 is formed. Then, the first conductive layer 190 that is not covered with the photosensitive dry film is removed by dry etching. Finally, the photosensitive dry film is removed to obtain the capacitor 100 shown in FIG. 6. It should be noted that after the dry etching, the first conductive layer 190 forms a first conductive region and a second conductive region that are separated from each other; and the first conductive region forms the first electrode layer 140 (the third electrode layer 220), and the second conductive region forms the second electrode layer 150 (the fourth electrode layer 230). Similarly, in this step, the first conductive layer 190 remains in a predetermined pattern region, and an excess portion of the first conductive layer 190 is removed to form a first conductive region and a second conductive region that are independent of each other. It should be understood that the pattern shape of the first conductive layer 190 remained may be designed according to capacitor specification requirements, and description will not be elaborated here.

Therefore, in the method for fabricating the capacitor provided by an embodiment of the present disclosure, a laminated structure including a larger number of conductive layers and insulating layers may be obtained by means of fabricating the laminated structure, and a capacitance value of the capacitor is increased, and the laminated structure formed by the first and second trench groups may further increase the capacitance value of the capacitor, thereby improving capacitance density of the capacitor.

FIG. 11 illustrates a schematic flow chart of a method 400 for fabricating a capacitor according to an embodiment of the present disclosure. It should be understood that FIG. 11 is described by an example of etching a first trench group 10 and a second trench group 20 at the same time, fabricating a laminated structure 130 in the first trench group 10 and the second trench group 20, and fabricating a first electrode 140, a second electrode 150, a third electrode 220 and a fourth electrode 230 at the same time. Of course, in the embodiment of the application, it is also possible to only etch the first trench group 10, fabricate the laminated structure 130 in the first trench group 10, and fabricate the first electrode 140 and the second electrode 150, a specific fabrication method only needs to omit the related description about the second trench group 20 and an electrode corresponding to the second trench group 20 in the method 300.

Specifically, as shown in FIG. 11, the method 400 for fabricating the capacitor includes:

step 401, a semiconductor substrate is etched to form a first trench group and a second trench group in the semiconductor substrate, where the first trench group includes at least two first trenches which enter the semiconductor substrate downward from an upper surface of the semiconductor substrate; and the second trench group includes at least two second trenches which enter the semiconductor substrate downward from the upper surface of the semiconductor substrate.

Figure 12A:
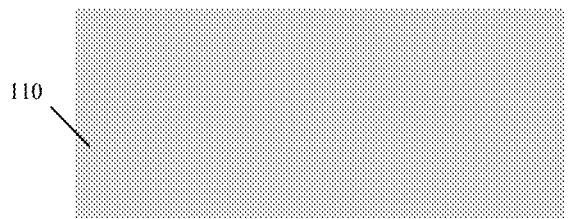
FIGS. 12a to 12m are schematic diagrams of a method for fabricating another capacitor according to an embodiment of the present disclosure.

Specifically, first, a photoresist is spin-coated on an upper surface (front surface) of a semiconductor substrate 110 as shown in FIG. 12a, and after exposure and development, an etched pattern window that is not covered with the photoresist is formed. Next, by using deep reactive ion etch, the first trench group 10 and the second trench group 20 are formed in the semiconductor substrate 110, as shown in FIG. 12b.

Step 402, a laminated structure is fabricated above the semiconductor substrate, in the first trench group and in the second trench group, where the laminated structure includes m insulating layer(s) and n conductive layers, and the m insulating layer(s) and the n conductive layers form a structure that a conductive layer and an insulating layer are adjacent to each other, so that corresponding insulating layer(s) in the m insulating layer(s) electrically isolates the n conductive layers from each other, and m and n are positive integers.

Optionally, it is assumed that m=2 and n=2, the laminated structure 130 includes: a second conductive layer 131, a third insulating layer 133, a third conductive layer 132 and a fourth insulating layer 134.

Figure 12B:
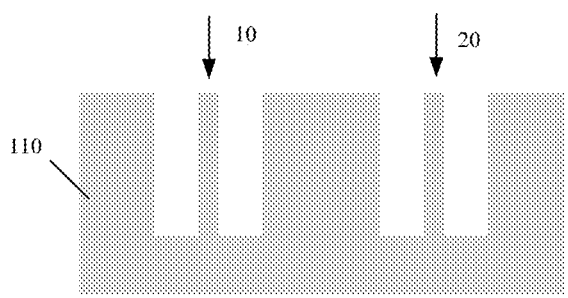
Figure 12C:
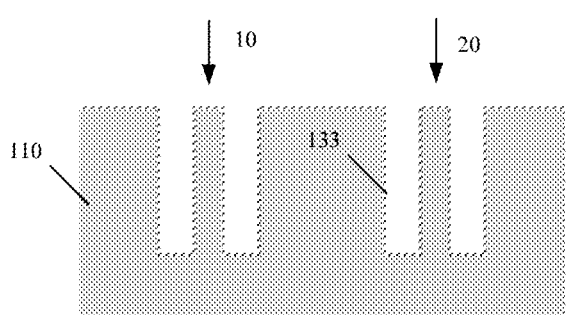
Figure 12D:
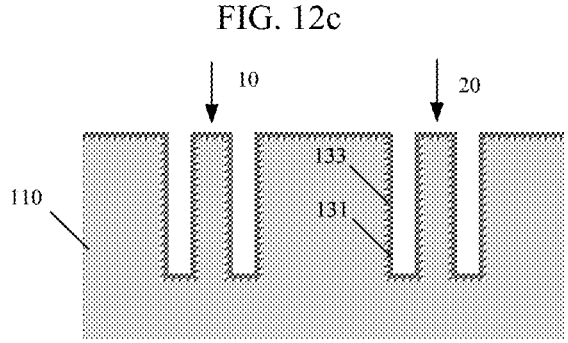
Figure 12E:
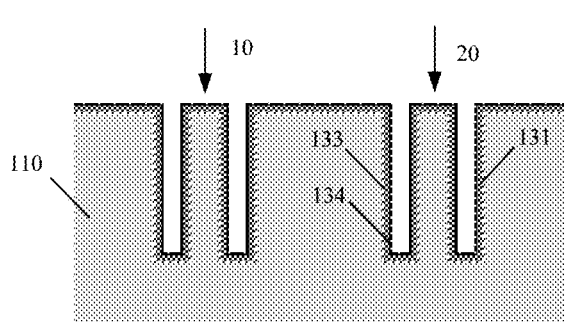
Figure 12F:
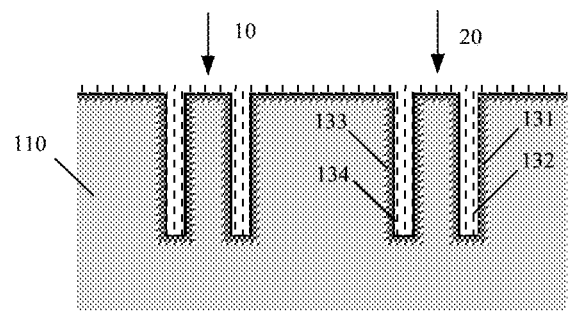
Figure 12G:
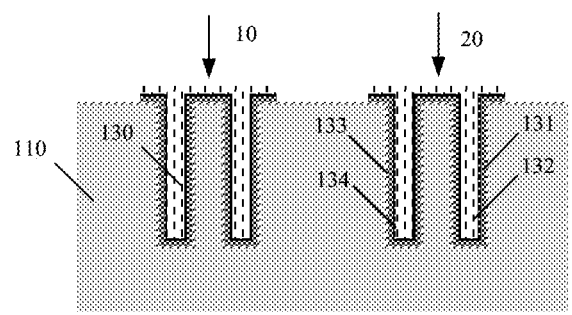

Specifically, first, in a structure shown in FIG. 12b, an insulating material is deposited on an upper surface of the semiconductor substrate 110, an inner surface of a first trench group 10 and an inner surface of a second trench group 20 to form a third insulating layer 133, as shown in FIG. 12c. Next, a conductive material is deposited on an upper surface and an inner surface of the third insulating layer 133 to form a second conductive layer 131, as shown in FIG. 12d. Then, an insulating material is deposited on an upper surface and an inner surface of the second conductive layer 131 and the upper surface of the semiconductor substrate 110 to form a fourth insulating layer 134, as shown in FIG. 12e. Then, a conductive material is deposited on an upper surface and an inner surface of the fourth insulating layer 134 and the upper surface of the semiconductor substrate 110 to form a third conductive layer 132, as shown in FIG. 12f. Finally, photolithography is performed on the third insulating layer 133, the second conductive layer 131, the fourth insulating layer 134 and the third conductive layer 132 to expose the upper surface of the semiconductor substrate 110, as shown in FIG. 12g.

It should be noted that when the photolithography is performed on the third insulating layer 133, the second conductive layer 131, the fourth insulating layer 134 and the third conductive layer 132, the following operations may be specifically included.

First, an upper surface of a structure shown in FIG. 12f is covered with a photosensitive dry film, and after exposure and development, a dry film protection layer covering the third conductive layer 132 is formed. Then, the third insulating layer 133, the second conductive layer 131, the fourth insulating layer 134 and the third conductive layer 132 that are not covered with the photosensitive dry film are removed by dry etching. Finally, the photosensitive dry film is removed to obtain patterns of the third insulating layer 133, the second conductive layer 131, the fourth insulating layer 134 and the third conductive layer 132, as shown in FIG. 12g. In this step, the patterns of the third insulating layer 133, the second conductive layer 131, the fourth insulating layer 134 and the third conductive layer 132 required remain, and excess portions of the third insulating layer 133, the second conductive layer 131, the fourth insulating layer 134 and the third conductive layer 132 are removed to expose the upper surface of the semiconductor substrate 110. It should be understood that the pattern shapes of the third insulating layer 133, the second conductive layer 131, the fourth insulating layer 134 and the third conductive layer 132 remained may be designed according to capacitance specification requirements, and description will not be elaborated here.

In the above operation of depositing the third insulating layer 133, for example, the deposition may be performed by thermal oxidation, ALD, CVD, or the like.

Optionally, the third insulating layer 133 and/or the fourth insulating layer 134 includes at least one of a silicon oxide layer, a silicon nitride layer, a silicon oxynitride layer, a metal oxide layer, a metal nitride layer and a metal oxynitride layer. A material of the third insulating layer 133 and/or the fourth insulating layer 134 may be silicon oxide, silicon nitride, silicon oxynitride, metal oxide, metal nitride and metal oxynitride, or the like, such as silicon dioxide, silicon nitride, silicon oxynitride, or high dielectric constant materials including aluminum oxide, hafnium oxide, zirconium oxide, titanium dioxide, $Y_2O_3$, $La_2O_3$, $HfSiO_4$, $LaAlO_3$, $SrTiO_3$, $LaLuO_3$, or the like; and it may also be one or a combination of the foregoing materials. A specific insulating material and a layer thickness may be adjusted according to a capacitance value, a frequency characteristic, a loss and other requirements of a capacitor. Of course, the third insulating layer 133 and/or the fourth insulating layer 134 may also include some other material layers having high dielectric constant characteristics, which is not limited in the embodiment of the present disclosure. For example, the third insulating layer 133 and/or the fourth insulating layer 134 may be a laminated layer with a material having a high dielectric constant, such as silicon dioxide/alumina/silicon dioxide ($SiO_2/Al_2O_3/SiO_2$).

In the foregoing operation of depositing the second conductive layer 131, the deposition may be performed by ALD, PVD, organometallic chemical vapor deposition, vapor deposition, electroplating, or the like.

Optionally, the second conductive layer 131 and/or the third conductive layer 132 includes at least one of a heavily doped polysilicon layer, a carbon-based material layer, a metal layer, a titanium nitride layer and a tantalum nitride layer. The foregoing metal layer may be at least one of an aluminum (Al) layer, a tungsten (W) layer, a copper (Cu) layer, a titanium (Ti) layer, a tantalum (Ta) layer, a platinum (Pt) layer, a ruthenium (Ru) layer, a iridium (Ir) layer and a rhodium (Rh) layer.

The foregoing operation of depositing the fourth insulating layer 134 may refer to the operation of depositing the third insulating layer 133, and the foregoing operation of depositing the third conductive layer 132 may refer to the operation of depositing the second conductive layer 131, which will not be repeatedly described here.

Step 403, an etching stop layer is deposited above the laminated structure.

Figure 12H:
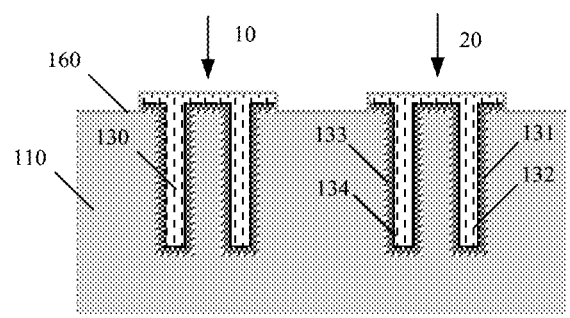

Specifically, in a structure shown in FIG. 12g, an etching stop layer 160 is deposited on upper surfaces of the second conductive layer 132 and the semiconductor substrate 110, as shown in FIG. 12h.

It should be noted that the deposition manner of the etching stop layer 160 may refer to the deposition manner of the third insulating layer 131, which will not be repeatedly described here.

Step 404, a fifth insulating layer is deposited on the etching stop layer.

Figure 12I:
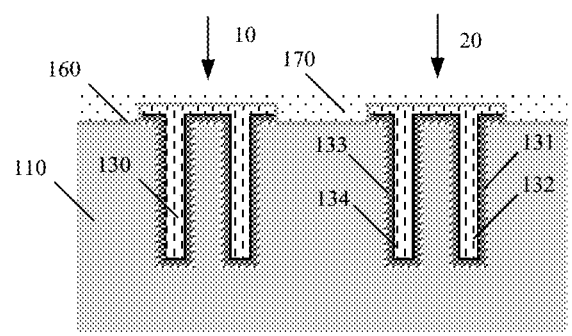

Specifically, in a structure shown in FIG. 12h, an insulating material is deposited on the etching stop layer 160 to form a fifth insulating layer 170, as shown in FIG. 12i.

It should be noted that the deposition manner of the fifth insulating layer 170 may refer to the deposition manner of the third insulating layer 131, which will not be repeatedly described here.

Optionally, a material of the fifth insulating layer 170 may be an organic polymer material, including polyimide, parylene, benzocyclobutene (BCB), or the like; it may also be some inorganic materials, including SOG, USG, BSG, PSG, BPSG, silicon oxide synthesized by TEOS, silicon oxide, silicon nitride and ceramic; and it may also be a combination of the foregoing materials.

Step 405, a second electrode layer (a fourth electrode layer) is fabricated in the fifth insulating layer and on an upper surface of the fifth insulating layer, and the second electrode layer is electrically connected to all even-numbered conductive layer(s) in the n conductive layers located in the first trench group and the semiconductor substrate, and the fourth electrode layer is electrically connected to all even-numbered conductive layer(s) in the n conductive layers located in the second trench group and the semiconductor substrate.

Figure 12J:
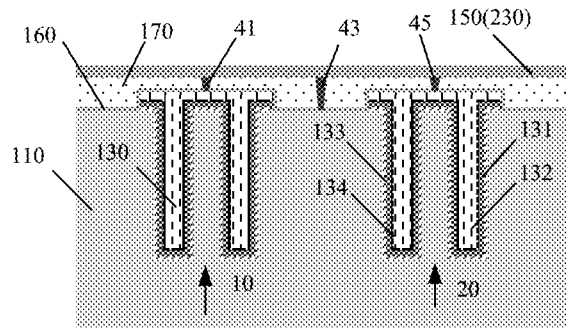

Specifically, first, in a structure shown in FIG. 12i, the fifth insulating layer 170 is etched by deep reactive ion etch to form at least one second via structure 41, at least one sixth via structure 45 and at least one fourth via structure 43 above the etching stop layer 160, and part of the etching stop layer 160 exposed at a bottom of the at least one second via structure 41 is removed to expose the third conductive layer 132 located in the first trench group 10, part of the etching stop layer 160 exposed at a bottom of the at least one sixth via structure 45 is removed to expose the third conductive layer 132 located in the second trench group 20, and part of the etching stop layer 160 exposed at a bottom of the at least one fourth via structure 43 is removed to expose the semiconductor substrate 110. Then, a conductive material is deposited on an upper surface of the fifth insulating layer 170, in the at least one second via structure 41, in the at least one sixth via structure 45 and in the at least one fourth via structure 43 to form a second electrode layer 150 (a fourth electrode layer 230), as shown in FIG. 12j.

It should be noted that the etching stop layer 160 is more resistant to etching than the fifth insulating layer 170; when the via structures are etched, bottoms of the via structures are enabled to stay on the etching stop layer 160 at different depths, and then part of the etching stop layer 160 exposed at the bottoms of the via structures is removed by a dry or wet process, so that the via structures penetrate through the etching stop layer 160. For example, a material of the fifth insulating layer 170 is silicon dioxide, and a material of the etching stop layer 160 is silicon nitride.

Therefore, setting the etching stop layer may better control an etching course to form the via structures.

Step 406, a lower surface of the semiconductor substrate is thinned to expose the first trench group and the second trench group.

Figure 12K:
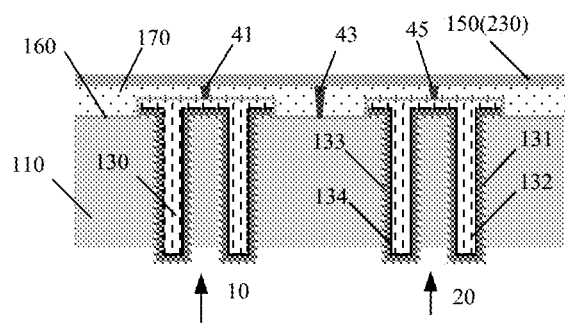

Specifically, in the structure shown in FIG. 12j, a lower surface of the semiconductor substrate 110 is thinned to expose the first trench group 10 and the second trench group 20, as shown in FIG. 12k.

Step 407, a first insulating layer is deposited on the lower surface of the semiconductor substrate to cover the first trench group and the second trench group.

Figure 12L:
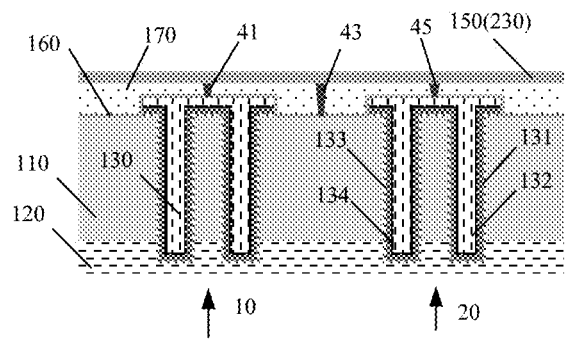

Specifically, in a structure shown in FIG. 12k, an insulating material is deposited on the lower surface of the semiconductor substrate 110 to form a first insulating layer 120, and the first insulating layer 120 covers the laminated structure 130, as shown in FIG. 12l.

Step 408, part of the first insulating layer and an insulating layer located at bottoms of the first trench and the second trench are removed from a lower surface of the first insulating layer to expose all odd-numbered conductive layer(s) in the n conductive layers.

Figure 12M:
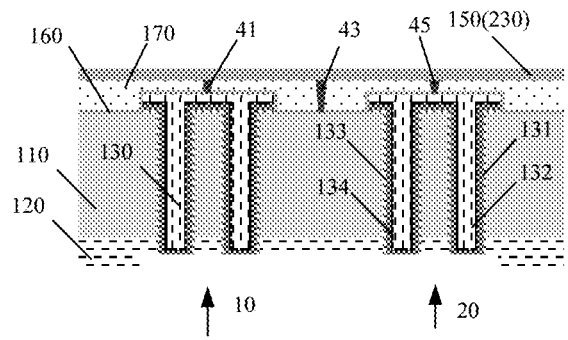

Specifically, in a structure shown in FIG. 12l, part of the first insulating layer 120 and the third insulating layer 133 located at the bottoms of the first trench and the second trench are removed from the lower surface of the first insulating layer 120 to expose the second conductive layer 131, as shown in FIG. 12m.

Step 409, a first electrode layer (a third electrode layer) is deposited on the lower surface of the first insulating layer, where the first electrode layer is electrically connected to all odd-numbered conductive layer(s) in the n conductive layers located in the first trench group, and the third electrode layer is electrically connected to all odd-numbered conductive layer(s) in the n conductive layers located in the second trench group.

Specifically, in a structure shown in FIG. 12m, a first electrode layer 140 (a third electrode layer 220) is deposited on the lower surface of the first insulating layer 120 to fabricate the capacitor 100 shown in FIG. 8.

It should be understood that the steps in the method 400 for fabricating the capacitor may refer to the corresponding the steps in the method 300 for fabricating the capacitor, which will not be repeatedly described here for brevity.

Therefore, in the method for fabricating the capacitor provided by an embodiment of the present disclosure, a laminated structure including a larger number of conductive layers and insulating layers may be obtained by means of fabricating the laminated structure, and a capacitance value of the capacitor is increased, and the laminated structure formed by at least one trench group may further increase the capacitance value of the capacitor, thereby improving capacitance density of the capacitor.

A method for fabricating a capacitor of the present disclosure is further described below in conjunction with a specific embodiment. For ease of understanding, the capacitor as shown in FIG. 7 is fabricated in this embodiment. Of course, the capacitors shown in FIGS. 1-6 and FIG. 8 may also be fabricated by using the method for fabricating the capacitor in this embodiment, except that design of trench groups and electrode layers, coverage area of an insulating layer and a conductive layer, or the like are slightly different, which will not be repeatedly described here for brevity.

Step 1: an SOI wafer with a diameter of 300 mm, for example, with crystal orientation of (100) is provided, where the SOI includes a semiconductor substrate, a first insulating layer (an intermediate insulating layer) and a base, the semiconductor substrate is a P-type heavily doped monocrystalline silicon (with resistivity of 1 mΩ·cm), and the first insulating layer is silicon dioxide with a thickness of 500 nm.

Step 2: a layer of photoresist is spin-coated on an upper surface (front side) of the semiconductor substrate, after exposure and development, a photoresist pattern is formed on the upper surface of the semiconductor substrate, and several arrays of trenches (trench groups) are etched by a DRIE process. The trench has an opening width of 1 micron and a depth of 25 microns. The first insulating layer is exposed at a bottom of the trench, that is, the trench enters the first insulating layer. Finally, the photoresist is removed.

Step 3: gaseous hydrofluoric acid is used to pass through the trench, to remove part of silicon dioxide (the first insulating layer) at and near the bottom of the trench, so as to form a cavity structure communicating the bottoms of the adjacent trenches.

Step 4: by using an atomic layer deposition (ALD) process, 25 nm hafnium oxide is deposited on the trench and an inner surface of the cavity structure as a third insulating layer.

Step 5, by using a low pressure chemical vapor deposition (LPCVD) process, 200 nanometers of heavily doped polysilicon is deposited on a surface of the third insulating layer as a second conductive layer. The second conductive layer forms a conductive platform with a larger area in the cavity structure, which is convenient for fabricating a first electrode layer (lower electrode) in the subsequent process.

Step 6, by using an ALD process, 25 nm hafnium oxide is deposited on a surface of the second conductive layer as a fourth insulating layer.

Step 7: by using an LPCVD process, 250 nanometers of a heavily doped polysilicon filling trench is deposited on a surface of the fourth insulating layer as the second conductive layer.

Step 8: by using a photolithography process, the third insulating layer, the fourth insulating layer, the second conductive layer and the third conductive layer that are located on the upper surface of the semiconductor substrate are patterned to partially expose the surface of the semiconductor substrate.

Step 9: first, by using a chemical vapor deposition (CVD) process, a layer of silicon nitride is deposited as an etching stop layer; and then, by using a CVD process, a silicon dioxide layer is deposited as the fifth insulating layer (an inter layer dielectric (ILD) layer).

Step 10, by using a photolithography process, several via holes penetrating through the fifth insulating layer are drilled at positions corresponding to the third conductive layer and the semiconductor substrate. Since a material of the etching stop layer is more resistant to etching than that of the fifth insulating layer, a bottom of each via hole is enabled to stay on the etching stop layer at different depths by one etching step. Then, part of the etching stop layer exposed at the bottoms of the via holes is removed by a dry or wet process. Then, a layer of titanium nitride is deposited in the via hole and the via hole is filled with tungsten by a CVD process. Finally, by using a physical vapor deposition (PVD) process, a layer of metallic copper is deposited as a second electrode layer (upper electrode).

Step 11: by using a wafer backside thinning process, a base of the SOI is corroded and removed in combination with a KOH solution to expose the first insulating layer and the third insulating layer. Then, by using a plasma etching process, hafnium oxide (the third insulating layer) whose surface is exposed is removed to expose the conductive platform formed by the second conductive layer.

Step 12: firstly, by using a PVD process, a layer of titanium nitride and a layer of copper are deposited on a back side of the whole SOI wafer, and then a pattern is formed by photolithography as the first electrode layer (lower electrode).

Step 13, dicing is performed along a scribe line to obtain discrete capacitor chips.

It should be noted that a position of the scribe line may be flexibly set according to actual needs, which is not limited in the present disclosure.

A person skilled in the art can understand that the preferred embodiments of the present disclosure are described in detail above with reference to the accompanying drawings. However, the present disclosure is not limited to specific details in the foregoing embodiments. Within the technical concept of the present disclosure, the technical solution of the present disclosure may carry out a variety of simple variants, all of which are within the scope of protection of the present disclosure.

In addition, it should be noted that various specific technical features described in the foregoing specific embodiments may be combined in any suitable manner under the condition of no contradiction. In order to avoid unnecessary repetition, various possible combination ways will not be separately described in the present disclosure.

In addition, any combination may be made between various embodiments of the present disclosure without departing from the idea of the present disclosure, it should also be regarded as the disclosure of the present disclosure.

What is claimed is:

1. A capacitor, comprising:
   a semiconductor substrate;
   a first insulating layer disposed under the semiconductor substrate;
   a first trench group disposed in the semiconductor substrate and the first insulating layer, wherein the first trench group comprises at least two first trenches which penetrate through the semiconductor substrate downward from an upper surface of the semiconductor substrate and enter the first insulating layer, and bottoms of the at least two first trenches are communicated to form a first cavity structure located in the first insulating layer;
   a laminated structure disposed above the semiconductor substrate, in the first trench group, and in the first cavity structure, wherein the laminated structure comprises m insulating layers and n conductive layers, and the m insulating layers and the n conductive layers form a structure that a conductive layer and an insulating layer are adjacent to each other so that corresponding insulating layers in the m insulating layers electrically isolates the n conductive layers from each other, and m and n are positive integers;
a first electrode layer electrically connected to all odd-numbered conductive layers in the n conductive layers disposed in the first trench group; and
a second electrode layer electrically connected to all even-numbered conductive layers in the n conductive layers disposed in the first trench group.

2. The capacitor according to claim 1, wherein the first electrode layer is electrically connected to all the odd-numbered conductive layers in the n conductive layers disposed in the first trench group through at least one first via structure.

3. The capacitor according to claim 1, wherein the second electrode layer is electrically connected to all the even-numbered conductive layers in the n conductive layers disposed in the first trench group through at least one second via structure.

4. The capacitor according to claim 1, wherein the first electrode layer is further electrically connected to the semiconductor substrate.

5. The capacitor according to claim 4, wherein the first electrode layer is electrically connected to the semiconductor substrate through at least one third via structure.

6. The capacitor according to claim 1, wherein the second electrode layer is further electrically connected to the semiconductor substrate.

7. The capacitor according to claim 6, wherein the second electrode layer is electrically connected to the semiconductor substrate through at least one fourth via structure.

8. The capacitor according to claim 6, wherein a corresponding insulating layer in the m insulating layers electrically isolates the n conductive layers from the semiconductor substrate.

9. The capacitor according to claim 1, wherein part or all of the n conductive layers are disposed in the first cavity structure.

10. The capacitor according to claim 1, wherein no insulating layer is provided under a conductive layer located at a bottom of the first trench group and a bottom of the first cavity structure.

11. The capacitor according to claim 1, wherein the capacitor further comprises:
a first conductive layer disposed under the first insulating layer, wherein the first conductive layer comprises a first conductive region and a second conductive region separated from each other, the first conductive region forms the first electrode layer, and the second conductive region forms the second electrode layer.

12. The capacitor according to claim 11, wherein the capacitor further comprises:
a base disposed between the first insulating layer and the first conductive layer, wherein the base forms a semiconductor on insulator (SOI) substrate with the semiconductor substrate and the first insulating layer; and
a second insulating layer disposed between the first conductive layer and the base to isolate the first conductive layer from the base.

13. The capacitor according to claim 1, wherein
the first electrode layer is disposed under the first insulating layer, and
the second electrode layer is disposed above the laminated structure.

14. The capacitor according to claim 1, further comprising a second trench group, a third electrode layer, and a fourth electrode layer,
wherein the second trench group is disposed in the semiconductor substrate and the first insulating layer and comprises at least two second trenches which penetrate through the semiconductor substrate downward from the upper surface of the semiconductor substrate and enter the first insulating layer, and bottoms of the at least two second trenches are communicated to form a second cavity structure located in the first insulating layer;
the laminated structure is further disposed in the second trench group and the second cavity structure, and there is no electrically connected conductive layer between the laminated structure disposed in the second trench group and the laminated structure disposed in the first trench group; and
the third electrode layer is electrically connected to all odd-numbered conductive layers in the n conductive layers disposed in the second trench group, and the fourth electrode is electrically connected to all even-numbered conductive layers in the n conductive layers disposed in the second trench group.

15. The capacitor according to claim 14, wherein
the third electrode and the first electrode are a same electrode, and the fourth electrode and the second electrode are a same electrode; or
the third electrode and the first electrode are different electrodes, and the fourth electrode and the second electrode are a same electrode; or
the third electrode and the first electrode are a same electrode, and the fourth electrode and the second electrode are different electrodes; or
the third electrode and the first electrode are different electrodes, and the fourth electrode and the second electrode are different electrodes.

16. A method for fabricating a capacitor, comprising:
providing a semiconductor on insulator (SOI) substrate, wherein the SOI substrate comprises a semiconductor substrate, a first insulating layer and a base, and the first insulating layer is disposed between the semiconductor substrate and the base;
fabricating a first trench group on the SOI substrate, wherein the first trench group comprises at least two first trenches which penetrate through the semiconductor substrate downward from an upper surface of the semiconductor substrate and enter the first insulating layer, and bottoms of the at least two first trenches are communicated to form a first cavity structure located in the first insulating layer;
fabricating a laminated structure above the semiconductor substrate, in the first trench group and in the first cavity structure, wherein the laminated structure comprises m insulating layers and n conductive layers, and the m insulating layers and the n conductive layers form a structure that a conductive layer and an insulating layer are adjacent to each other, so that corresponding insulating layers in the m insulating layers electrically isolates the n conductive layers from each other, and m and n are positive integers; and
fabricating a first electrode layer and a second electrode layer, wherein the first electrode layer is electrically connected to all odd-numbered conductive layers in the n conductive layers located in the first trench group, and the second electrode layer is electrically connected to all even-numbered conductive layers in the n conductive layers located in the first trench group.

17. The method according to claim 16, wherein the fabricating the first trench group on the SOI substrate comprises:

etching the SOI substrate to form the first trench group in the SOI substrate, and removing part of the first insulating layer exposed at the bottoms of the at least two first trenches to form the first cavity structure communicating with the bottoms of the at least two first trenches.

18. The method according to claim 16, wherein the first cavity structure is formed between the first insulating layer and the semiconductor substrate in the SOI substrate; and the fabricating the first trench group on the SOI substrate comprises:

etching the SOI substrate to form the first trench group in the SOI substrate, wherein the first cavity structure is communicated with the bottoms of the at least two first trenches.

19. The method according to claim 16, wherein the method further comprises:

removing the base to expose the first insulating layer and an insulating layer located at a bottom of the first trench group and a bottom of the first cavity structure; and removing the insulating layer located at the bottom of the first trench group and the bottom of the first cavity structure to expose a conductive layer located at the bottom of the first trench group and the bottom of the first cavity structure.

20. The method according to claim 19, wherein the method further comprises:

depositing a first conductive layer under the first insulating layer;

wherein the fabricating the first electrode layer and the second electrode layer comprises:

etching the first conductive layer to form a first conductive region and a second conductive region separated from each other, wherein the first conductive region forms the first electrode layer and the second conductive region forms the second electrode layer.

* * * * *